US008368676B2

(12) United States Patent
Satoh et al.

(10) Patent No.: US 8,368,676 B2
(45) Date of Patent: Feb. 5, 2013

(54) DISPLAY DEVICE WITH LIGHT SHIELD

(75) Inventors: Masakazu Satoh, Osaka (JP); Hiromi Katoh, Osaka (JP); Benjamin James Hadwen, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 492 days.

(21) Appl. No.: 12/526,887

(22) PCT Filed: May 19, 2008

(86) PCT No.: PCT/JP2008/059124
§ 371 (c)(1),
(2), (4) Date: Aug. 12, 2009

(87) PCT Pub. No.: WO2008/143211
PCT Pub. Date: Nov. 27, 2008

(65) Prior Publication Data
US 2010/0110096 A1 May 6, 2010

(30) Foreign Application Priority Data
May 18, 2007 (JP) .................................. 2007-133506

(51) Int. Cl.
G06F 3/038 (2006.01)
(52) U.S. Cl. ......................................... 345/207; 345/87
(58) Field of Classification Search ............ 345/87–104, 345/60–63, 76–83, 207
See application file for complete search history.

(56) References Cited

U.S. PATENT DOCUMENTS

| 4,704,024 | A | 11/1987 | Tsunekawa |
| 4,746,620 | A | 5/1988 | Diadiuk et al. |
| 6,316,955 | B1 | 11/2001 | Shimamura et al. |
| 7,046,282 | B1 * | 5/2006 | Zhang et al. .................. 348/294 |
| 7,427,735 | B2 | 9/2008 | Eskerud |
| 7,468,722 | B2 | 12/2008 | Ferguson |
| 2003/0043328 | A1 | 3/2003 | Hayashi |
| 2004/0043676 | A1 | 3/2004 | Tada et al. |
| 2004/0049757 | A1 | 3/2004 | Vidhani |
| 2004/0145033 | A1 | 7/2004 | McElvain |
| 2004/0189567 | A1 * | 9/2004 | Kimura .......................... 345/87 |
| 2004/0227719 | A1 | 11/2004 | Chang et al. |
| 2005/0045881 | A1 | 3/2005 | Nakamura et al. |

(Continued)

FOREIGN PATENT DOCUMENTS
EP 1 107 222 A2 6/2001
EP 1 511 084 A2 3/2005
(Continued)

OTHER PUBLICATIONS

U.S. Office Action mailed Dec. 8, 2011 in U.S. Appl. No. 12/526,708.
(Continued)

Primary Examiner — Alexander Eisen
Assistant Examiner — Nelson Lam
(74) Attorney, Agent, or Firm — Nixon & Vanderhye P.C.

(57) ABSTRACT

A light shield (204) for blocking light traveling toward a PIN photodiode (413) from a glass substrate (314) side is formed of a conductive material, and a reference electric potential (Vr−nVoc) equal to that of a cathode of the PIN photodiode (413) is applied to the light shield (204) from a power supply circuit (266). Thus, inductive noise for a photoelectric conversion device used for an ambient light sensor is further reduced in a display device.

13 Claims, 21 Drawing Sheets

U.S. PATENT DOCUMENTS

| | | |
|---|---|---|
| 2005/0067553 A1* | 3/2005 | Agari et al. .................... 250/205 |
| 2005/0190316 A1 | 9/2005 | Takahashi et al. |
| 2005/0199876 A1 | 9/2005 | Matsumoto |
| 2005/0231457 A1* | 10/2005 | Yamamoto et al. ........... 345/102 |
| 2005/0275616 A1 | 12/2005 | Park et al. |
| 2007/0063957 A1* | 3/2007 | Awakura et al. ................ 345/98 |
| 2007/0070025 A1 | 3/2007 | Fujita et al. |
| 2007/0120261 A1 | 5/2007 | Ho |
| 2007/0188441 A1 | 8/2007 | Tanaka et al. |
| 2008/0049005 A1 | 2/2008 | Okita et al. |
| 2009/0050891 A1 | 2/2009 | Katoh |
| 2009/0066897 A1 | 3/2009 | Katoh et al. |
| 2009/0122039 A1 | 5/2009 | Katoh et al. |
| 2009/0135115 A1 | 5/2009 | Sakamoto et al. |
| 2010/0026192 A1* | 2/2010 | Hadwen et al. ................ 315/149 |
| 2010/0060562 A1* | 3/2010 | Hadwen et al. ................ 345/102 |
| 2011/0199349 A1* | 8/2011 | Katoh ............................ 345/207 |

FOREIGN PATENT DOCUMENTS

| | | |
|---|---|---|
| JP | 63-207183 | 8/1988 |
| JP | 64-9655 | 1/1989 |
| JP | 7-335932 | 12/1995 |
| JP | 2003-273361 | 9/2003 |
| JP | 2004-54281 | 2/2004 |
| JP | 2006-118965 A | 5/2006 |
| JP | 2006-284936 A | 10/2006 |
| WO | WO 2006/104204 | 10/2006 |
| WO | 2006-117956 | 11/2006 |
| WO | 2006-118044 A1 | 11/2006 |
| WO | 2006/118066 A1 | 11/2006 |
| WO | WO 2006/129427 | 12/2006 |

OTHER PUBLICATIONS

European Search Report mailed Jan. 4, 2011 in EP application 08764342.5.

Office Action for U.S. Appl. No. 12/526,741 mailed Mar. 13, 2012; Satoh.

EP Search Report mailed Mar. 21, 2011 in European application 08752944.2.

International Search Report for PCT/JP2008/059124, mailed Jun. 17, 2008.

Koide, S. et al., "LTPS Ambient Light Sensor with Temperature Compensation", IDW 06, pp. 689-690, (2006).

U.S. Appl. No. 12/526,741, filed Aug. 11, 2009, entitled "Display Device".

U.S. Appl. No. 12/526,708, filed Aug. 11, 2009, entitled "Display Device".

Office Action from U.S. Appl. No. 12/526,741 mailed Aug. 20, 2012; Satoh et al.

"Final" Office Action from U.S. Appl. No. 12/526,708, dated Jun. 6, 2012; Satoh et al.

Notice of Allowance from U.S. Appl. No. 12/526,708 dated Aug. 22, 2012; Satoh et al.

* cited by examiner

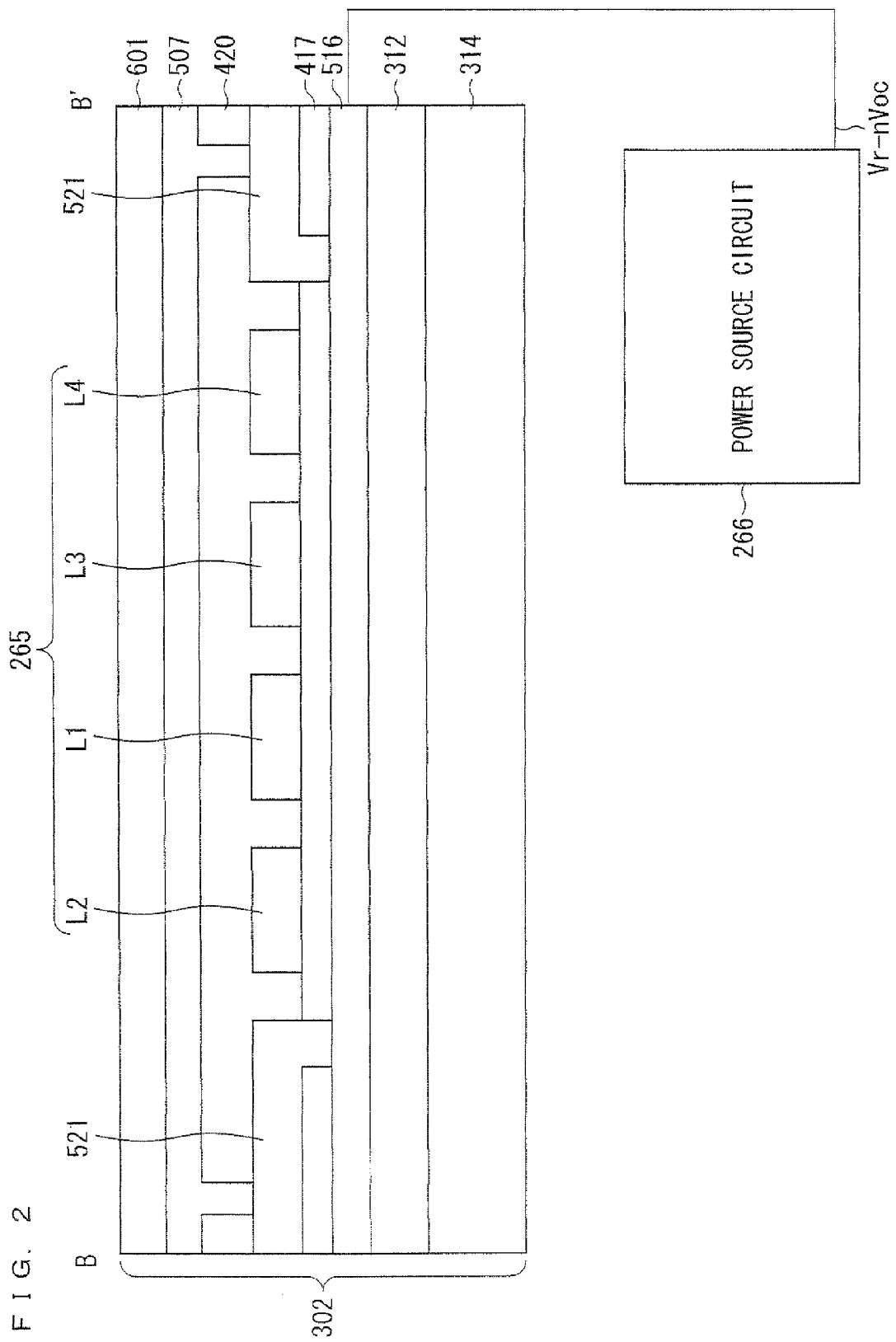
F I G. 2

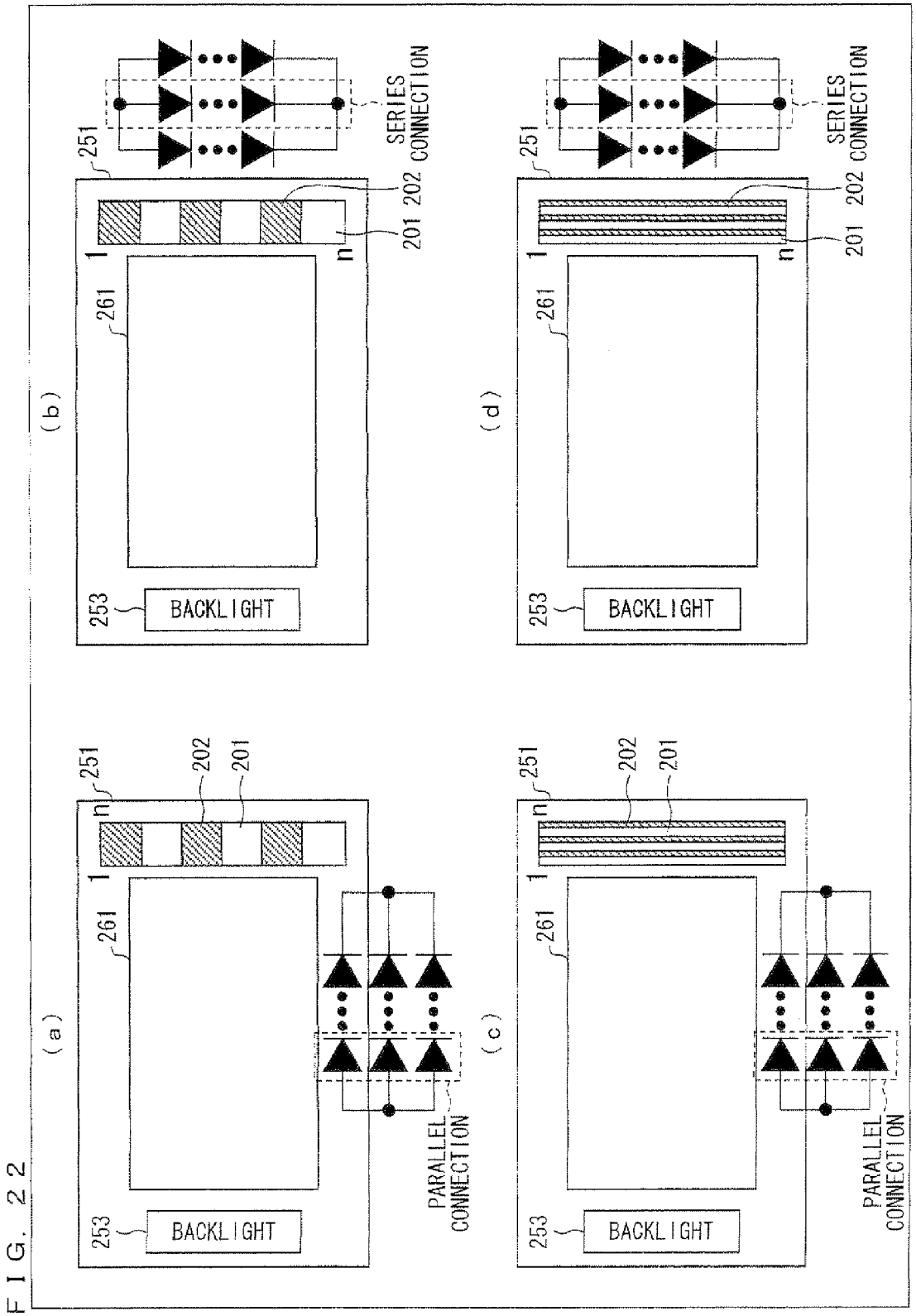

DISPLAY DEVICE WITH LIGHT SHIELD

This application is the U.S. national phase of International Application No. PCT/JP2008/059124 filed 19 May 2008, which designated the U.S. and claims priority to JP Application No. 2007-133506 filed 18 May 2007, the entire contents of each of which are hereby incorporated by reference.

TECHNICAL FIELD

The present invention relates to a display device including an ambient light sensor.

BACKGROUND ART

As portable terminals (e.g., a mobile phone and a PDA) provided with a liquid crystal display, the ones including an ambient light sensor system are widely used, the ambient light sensor system adjusting a luminance of a backlight of the liquid crystal display in accordance with a brightness of its surroundings. In a display capable of transmissive liquid crystal mode operation, the ambient light sensor system detects an intensity of ambient light by means of an ambient light sensor provided in the peripheral of a panel. If the intensity of the ambient light is weak, the ambient light sensor system reduces the luminance of the backlight; if the intensity of the ambient light is strong, the ambient light sensor system increases the luminance of the backlight. By carrying out this control, the ambient light sensor system provides a user with a comfortable view. Such adjustment of the luminance of the backlight is also applied to light transmitted to a keyboard provided for the portable terminal.

In general, a PIN photodiode is used for the ambient light sensor. The PIN photodiode can be formed, by means of a low-temperature polycrystalline silicon process, on a liquid crystal panel so as to be monolithic with an element for displaying. FIG. 8 shows a configuration of an ambient light sensor, disclosed in Non-Patent Literature 1, which uses a PIN photodiode.

In this ambient light sensor, two PIN photodiodes 101 and 102 are connected in series in a reverse bias condition. A cathode of the PIN photodiode 101 is connected with a power source supplying +4V, and an anode of the PIN photodiode 102 is connected with GND. This causes a reverse bias of 2 V to be applied to each of the PIN photodiodes 101 and 102. The PIN photodiode 101 detects ambient light AL, and outputs a photocurrent Ip corresponding to the intensity of the ambient light AL. The PIN photodiode 102 is a reference photodiode. For the PIN photodiode 102, a light shield 103 is provided which prevents the incidence of the ambient light AL on a photoreceptor of the PIN photodiode 102. The PIN photodiode 102 outputs a dark current Id. The photocurrent Ip also includes the dark current Id. A connecting point Q (Vq) between an anode of the PIN photodiode 101 and a cathode of the PIN photodiode 102 outputs a differential current expressed by $\Delta I = Ip - Id$. Based on $\Delta I$ thus outputted, the intensity of the ambient light AL can be detected.

CITATION LIST

Patent Literature 1
Japanese Patent Application Publication, Tokukai, No. 2004-119719 A (Publication Date: Apr. 15, 2004)
Patent Literature 2
Japanese Patent Application Publication, Tokukaisho, No. 63-207183 A (Publication Date: Aug. 26, 1988)
Patent Literature 3
WO2006/104204 (Internationally published on Oct. 5, 2006)
Non-Patent Literature 1
S. Koide et al. "LTPS Ambient Light Sensor with Temperature Compensation", IDW '06, pp. 689-690 (2006)

SUMMARY OF INVENTION

The above-described configuration of Non-Patent Literature 1 is based on a relationship between an output current of a PIN photodiode and a bias voltage, which relationship is shown in FIG. 9. The curved line c1 indicates the relationship observed when no ambient light AL is incident, and the curved line c2 indicates the relationship observed when ambient light AL of a predetermined intensity is incident. Both of the curved lines show the following fact: (i) a current flows in a reverse direction of the PIN photodiode in a case where a bias voltage is smaller than an open circuit voltage of around 0 V; and (ii) a current flows in a forward direction of the PIN photodiode in a case where a bias voltage is greater than the open circuit voltage. A bias voltage with a minus sign indicates application of a reverse bias.

The ambient light sensor shown in FIG. 8 is in the following state: When ambient light AL of a certain intensity is incident on the ambient light sensor, the PIN photodiode 101 outputs a current corresponding to a point of the curved line c2 at which point the bias voltage is −2 V, and the PIN photodiode 102 outputs a current corresponding to a point of the curved line c1 at which point the bias voltage is −2 V. In this case, in FIG. 9, a difference between the currents corresponding to the points of the respective curved lines c1 and c2 at each of which points the bias voltage is −2 V is determined as the detected current $\Delta I$ with respect to the ambient light AL.

However, in a case where the differential current $\Delta I$ is obtained at certain bias points of curved lines adjacent to each other, as the curved lines c1 and c2 in FIG. 9, the differential current $\Delta I$ is difficult to accurately correspond to the intensity of the ambient light AL because an output current indicated by the curved line c1, which indicates the dark current Id, is far larger than the differential current $\Delta I$. That is, because (i) an SN ratio of the differential current $\Delta I$ is low and (ii) a variation occurs in the curved lines c1 and c2 due to variations of PIN photodiodes which variations are made in manufacturing, the differential current $\Delta I$ is difficult to be stabilized.

In view of this, a configuration of an ambient light sensor as illustrated in FIG. 10 is considered. In the configuration of FIG. 10, each of a detecting device (first photoelectric conversion device) 201 and a reference device (second photoelectric conversion device) 202 is made of n (n>1) PIN photodiodes (photoelectric conversion device elements) connected in series. For example, the "n" may be 10 or 100, and is not limited to any specific number. The detecting device 201 detects ambient light AL. For the detecting device 201, a light shield 204 is provided. The light shield 204 prevents the incidence of backlight light B/L, as stray light, on the detecting device 201, the backlight light B/L being emitted from a backlight of a liquid crystal display device. The light shields 204 are provided for the detecting device 201 and the reference device 202, respectively, so as to be closer to a back surface side of a display panel (corresponding to a display panel 251 in FIG. 14) than the detecting device 201 and the reference device 202 are. For the reference device 202, a light shield 203 and the light shield 204 are provided. The light shield 203 prevents the incidence of the ambient light AL on the reference device 202, and the light shield 204 prevents the incidence of backlight light B/L, as stray light, on the reference device 202. Light having a reference brightness is incident on the reference device 202. An anode-side terminal (current output terminal) of the detecting device 201 and an anode-side terminal (current output terminal) of the reference device 202 are connected with wiring L1 and wiring L3, respectively, each of which wiring L1 and L3 is power source wiring supplying a reference electric potential Vr. A cathode-side terminal (current output terminal) of the detecting device 201 is connected with an inverting input terminal of an operational amplifier 205 via wiring L2, and a cathode-side terminal (current output terminal) of the reference device 202 is connected with a non-inverting input terminal of an operational amplifier 205 via wiring L4. Further, an integral capacitor 206 is connected between an output terminal of the operational amplifier 205 and the inverting input terminal of the operational amplifier 205. The integral capacitor 206 is connected with a switch 207 in parallel.

The output terminal of the operational amplifier 205 is connected with one end of a switch 208. The other end of the switch 208 is connected with one end of a hold capacitor 209. The other end of the hold capacitor 209 is connected with GND. A voltage of the hold capacitor 209 is an input to an A/D converter 210. An output of the A/D converter 210 is transmitted to a computer system via an interface 211, the computer system being controlled by a CPU or a microcontroller.

In the ambient light sensor having this configuration, in order that no current flows to the reference device 202, an open circuit voltage Voc is applied to the reference device 202 in a dark state in which the ambient light AL and the backlight light B/L are blocked. The reason why the open circuit voltage Voc is applied will be described later. In order to apply the open circuit voltage Voc as described above, an electric potential of the anode-side terminal of the reference device 202 is set to Vr, and an electric potential of the cathode-side terminal of the reference device 202 is set to Vr−Voc. Accordingly, an electric potential of the cathode-side terminal of the detecting device 201 also becomes Vr−Voc, and a bias voltage equal to the open circuit voltage Voc is applied to the detecting device 201.

Thereby, a current flows in the detecting device 201, the current being the one which flows while the bias voltage equal to the open circuit voltage Voc is applied in a direction from the cathode to the anode and which corresponds to the intensity of the ambient light AL. Further, when the switch 207 is off and the switch 208 is on, an electric charge is accumulated in the integral capacitor 206 with time, and as a result an output voltage Vo is generated in the integral capacitor 206. Then, by turning the switch 208 off after a predetermined period of time, the output voltage Vo is held by the hold capacitor 209. A change in a voltage of the integral capacitor 206 observed in this case is indicated by the straight line c3 in FIG. 17. For example, during an integration period, turning off the switch 208 at the point of 85 msec causes a voltage at the point P1, 85 mV, to be held. The held voltage is analog-to-digital converted by the A/D converter 210, and is outputted to the computer system via the interface 211. Further, by turning on the switches 207 and 208 simultaneously, it is possible to initialize the integral capacitor 206 and to allow the hold capacitor 209 to hold the voltage Vr−Voc. Therefore, by subtracting the result of the analog-to-digital converting of the voltage Vr−Voc from the result of the analog-to-digital converting of the held voltage obtained by the integration of the detected photocurrent, it is possible to obtain a net increase in a voltage which increase is caused by the photocurrent. Alternatively, such a configuration is also possible that a difference in the held voltage itself is analog-to-digital converted. With this configuration, it is possible to obtain a more accurate result.

FIG. 11 shows curved lines illustrating a relationship between an output current Iac and a bias voltage Vb with respect to one PIN photodiode, the curved lines respectively showing (i) a case where no light is incident (indicated by the continuous curved line) and (ii) a case where light is incident (indicated by the dotted curved line). These curved lines respectively correspond to the curved lines c1 and c2 of FIG. 9 enlarged around the bias voltage of Vb=0V. The open circuit voltage Voc observed in the case where no light is incident is almost 0 V, and the open circuit voltage observed in the case where light is incident is shifted to a positive side from that observed in the case where no light is incident, as indicated by Voc' in FIG. 11.

Accordingly, if an output current is drawn out while the open circuit voltage Voc is applied to the photodetecting device 201, a dark current obtained in this bias state has a very small value, nearly 0. This makes it possible to obtain the integration result of the photocurrent only, and thereby the SN ratio of the output voltage Vo is significantly improved. Further, it is possible to detect light ranging from feeble light to high-intensity light. With this, a broad dynamic range of the detection is achieved.

Furthermore, as described above, this configuration is made of the series connection of n PIN photodiodes. Therefore, in the case where no light is incident, a total open circuit voltage of the series connection is nVoc, as shown in FIG. 12. The nVoc is n-times greater than the open circuit voltage Voc obtained in a case where one PIN photodiode is used. Also in the case where light is incident, a total open circuit voltage of the series connection is n-times greater than the open circuit voltage Voc' obtained in the case where one PIN photodiode is used, although this is not shown in FIG. 12. FIG. 12 shows a case of n=100. In this case, the curved line illustrating the relationship between the output current Iac and the bias voltage Vb is extended in a horizontal direction. Therefore, a change in the output current Iac around the open circuit voltage nVoc is gentle, thereby increasing a range of the bias voltage Vb in which range the output current Iac obtains a small value. Therefore, by adopting this series connection configuration as in the configuration of FIG. 10, the open circuit voltage nVoc is generated in the reference device 202, and the bias voltage Vb equal to this open circuit voltage nVoc is applied to the photodetecting device 201. The open circuit voltage nVoc is approximately 0.1 V in a case of n=7, as shown in FIG. 13. In this case, a current corresponding to the bias voltage of 0.1 V flows to the photodetecting device 201.

With this, as shown in FIG. 12, the curved line observed in the case where light is incident is sufficiently flat around the bias voltage, because there are variations in the characteristics of the PIN photodiodes, the operational amplifier 250, and the like. Therefore, the output current of the photodetecting device 201 hardly changes. Further, around the bias voltage, the dark current of the photodetecting device 201 hardly changes or changes very slightly, thereby making it possible to maintain a very good SN ratio of the output voltage Vo. In FIG. 10, such an error of a state with respect to the photodetecting device 201 and the reference device 202 is included in the non-inverse input as "e". By using the series connection configuration of the PIN photodiodes, even if there is the error "e", it is possible to absorb the error "e" and thereby to accurately detect an intensity of ambient light AL. Note that such a configuration is also possible that a plurality of series connections of the PIN photodiodes are connected in parallel with each other. In this configuration, the number of series connections connected in parallel is determined in accordance with the output current desired to be obtained by the photodetecting device 202.

Next, FIG. 14 shows an example of a configuration of a liquid crystal display device 250 provided with an ambient light sensor having such the configuration.

The liquid crystal display device 250 is a display device of a mobile phone, for example. The liquid crystal display device 250 includes the display panel 251, a control substrate 252, and a backlight 253.

The display panel 251 includes a matrix display section 261, a gate driver 262, a source driver 263, and the ambient light sensor described with reference to FIG. 10. The matrix display section 261 is a vertically-long screen. The gate driver 262 is provided in one vertical side of a picture-frame region. The source driver 263 is provided in one horizontal side of the picture-frame region. The gate driver 262 and the source driver 263 may be realized in different manners, for example, they may be realized by an IC mounting, a COG mounting, or monolithic formation on the display panel 251. In addition to these, such an embodiment is also possible that the gate driver 262 and the source driver 263 are mounted on an external substrate such as a flexible printed circuit and are connected with the display panel 251.

Further, in the other one horizontal side of the picture-frame region, a detecting device 201 and a reference device 202 of the ambient light sensor are provided such that they are adjacent to each other laterally. The detecting device 201 and the reference device 202 are provided in the display panel 251. Further, in the other one vertical side of the picture-frame region, an operational amplifier 205, an integral capacitor 206, switches 207 and 208, a hold capacitor 209, and an A/D converter 210, each of which is of the ambient light sensor, are provided such that they are adjacent to the source driver 263. Alternatively, these may be provided in said one horizontal side of the picture-frame region where the source driver 263 is provided. These can be realized by a discrete element mounting or an IC mounting (including a COG mounting), or monolithic formation on the display panel 251. Further, as well as the drivers, these can be mounted on an external substrate.

The control substrate 252 includes a display controller 271, a backlight controller 272, and an ALS controller 273. The display controller 271 controls operation of the gate driver 262 and the source driver 263 of the display panel 251. The backlight 253 is made of an LED, a cold cathode fluorescent tube, or the like. The backlight controller 272 controls lighting of the backlight 253. The ALS controller 273 outputs, to the backlight controller 272, a control signal for adjusting a luminance of the backlight 253 based on an intensity of ambient light detected, which is transmitted from the ambient light sensor of the display panel 251. For example, in a case where the backlight 253 is made of LEDs, a current to be flown to the LEDs and the number of LEDs to be lighten up are changed. In a case where the backlight 253 is made of cold cathode fluorescent tubes, the number of cold cathode fluorescent tubes to be lighten up is changed. An interface 211 of the ambient light sensor may be provided together with an A/D converter 210, or may be provided on the ALS controller 273 side. This is determined as needed depending on a range in which a bus for transmitting digital data is laid on.

FIG. 15 shows a cross-sectional configuration of the matrix display section 261.

The matrix display section 261 includes an active matrix substrate 302, a counter substrate 303, and a display medium (liquid crystal) 304 sandwiched between the active matrix substrate 302 and the counter substrate 303.

The active matrix substrate 302 includes a glass substrate 314 on which a base coating 312, a TFT 306, an inter-layer insulating film 320, and a pixel electrode 307 are provided. The TFT 306 is configured such that, on the base coating 312, a polycrystalline silicon film 313, a gate insulating film 315 (such as a silicon oxide film or a silicon nitride film), a gate electrode 316 (such as Al, Mo, Ti, W, or an alloy thereof), an inter-layer insulating film 317 (such as a silicon oxide film or a silicon nitride film), a source electrode 318 (such as Al, Mo, Ti, W, or an alloy thereof), and a drain electrode 319 (such as Al, Mo, Ti, W, or an alloy thereof) are stacked in order and formed by patterning.

The polycrystalline silicon film 313 includes a channel region, a source region, and a drain region. The source region and the drain region are provided on both sides of the channel region, respectively, and are made of an layer heavily doped with impurities. The source electrode 318 and the drain electrode 319 are drawn out onto the inter-layer insulating film 317 via respective contact holes made through the gate insulating film 315 and the inter-layer insulating film 317. The inter-layer insulating film 320 (e.g., an organic insulating film having photosensitivity, such as acrylic, polyimide, BCB (Benzo-Cyclo-Butene)) is formed so as to cover the TFT 306. The pixel electrode 307 (e.g., ITO (Indium-Tin-Oxide) or IZO (Indium-Zinc-Oxide)) is formed on the inter-layer insulating film 320, and is connected with the drain electrode 319 via a contact hole made through the inter-layer insulating film 320. Beside these, an auxiliary capacitor and/or the like is provided.

The counter substrate 303 is configured such that a color filter 331 and a counter electrode 332 are stacked on a glass substrate 330 in order. Besides these, a black matrix and/or the like is provided as needed.

FIG. 16 shows an arrangement for a PIN photodiode used in the detecting device 201 and the reference device 202 of the ambient light sensor.

This arrangement is formed on the active matrix substrate 302. On a glass substrate 314, a light shield 204, a base coating 312, a PIN photodiode 413, an insulating film 415, an inter-layer insulating film 417, an anode electrode 418, a cathode electrode 419, an inter-layer insulating film 420, and a shield (a shield against an electric field) 407 are stacked in order and formed by patterning. In the reference device 202, a light shield 203 may be further provided on the shield 407.

The light shield 204 is provided in a display panel so as to be closer to a back surface side of the display panel than the PIN photodiode 413 is. In consideration of an annealing process and an activating process, suitable examples of a material of the light shield 204 encompass Mo and W, each of which is a metal having a high melting point. However, instead of this, the light shield 204 may be formed of a conductive film (e.g., the same metal as the one used for the gate electrode, the source electrode, and the drain electrode) which is made to have a low transmittance. The PIN photodiode 413 is a photodiode which is made of a polycrystalline silicon film and has a lateral configuration. The PIN photodiode 413 includes an i layer at the center, and further includes a p+ layer and an n+ layer on both sides of the i layer. The p$^+$ layer and the n$^+$ layer have been heavily doped. The polycrystalline silicon film may be formed in a layer where the polycrystalline film 313 of the TFT 306 is provided.

The insulating film 415 is made of a silicon oxide film or a silicon nitride film. The insulating film 415 may be formed by using a layer where the gate insulating film 315 of the TFT 306 is provided. The inter-layer insulating film 417 is made of a silicon oxide film or a silicon nitride film. The inter-layer insulating film 417 may be formed by using a layer where the inter-layer insulating film 417 of the TFT 306 is formed. The anode electrode 418 contacts, from above the inter-layer insulating film 417, the p+ region of the PIN photodiode 413 via a contact hole made through the inter-layer insulating film 417 and the insulating film 415; the cathode electrode 419 contacts, from above the inter-layer insulating film 417, the n+ region of the PIN photodiode 413 via a contact hole made through the inter-layer insulating film 417 and the insulating film 415. The inter-layer insulating film 420 is made of an organic insulating film or the like. The inter-layer insulating film 420 may be formed by using a layer where the inter-layer insulating film 320 of the matrix display section 261 is provided.

The shield 407 is made of a conductive film. The shield 407 may be formed by using a layer where the pixel electrode 307 of the matrix display section 261 is provided. The shield 407 is connected with a power source supplying a constant electric potential. Thereby, the shield 407 prevents an electric field from affecting the PIN photodiode 413, the electric field occurring when the counter electrode 332 is driven by an electric potential change. The light shield 203 is a light-blocking film. When ambient light AL travels toward the PIN photodiodes 413 of the detecting device 201 through a window of a housing of the liquid crystal display device 250, the light shield 203 prevents the ambient light AL from reaching, due to reflection and diffusion, the PIN photodiodes 413 of the reference device 202. The light shield 203 may be formed of a conductive film which is made to have a low transmittance. Instead of this, the light shield 203 may be formed as a black matrix provided on the counter substrate side.

FIG. 19 shows a cross-sectional configuration of a diode for a photosensor, disclosed in Patent Literature 1.

A silicon film 102 is formed on a glass substrate 101, and a semiconductor layer 110 made of a polycrystalline silicon is formed on the silicon film 102. The semiconductor layer 110 includes a p region 111, an i region 112, and an n region 113, which are arranged in order so as to be adjacent to each other. On the silicon film 102, a silicon oxide film 103 is formed. On the silicon oxide film 103, a gate electrode 114 is formed. On the silicon oxide film 103 on which the gate electrode 114 is thus formed, a silicon oxide film 104 is formed. An anode electrode 115 is formed on a part of the silicon oxide film 104 which part corresponds to the p region 111, and a cathode electrode 116 is formed on a part of the silicon oxide film 104 which part corresponds to the n region. The anode electrode 115 contacts the p region 111 via a contact hole made through the silicon oxide films 103 and 104; the cathode electrode 116 contacts the n region 113 via a contact hole made through the silicon oxide films 103 and 104. The cathode electrode 116 is grounded. On the silicon oxide film 104 on which the anode electrode 115 and the cathode electrode 116 are formed, a silicon nitride film 105 is formed.

A configuration of FIG. 19 is such that a gate voltage is supplied to the gate electrode 114 so that current-voltage characteristics of the diode for the photosensor are changed. The gate voltage compensates a difference in the current-voltage characteristics which difference is made between (i) a case where no light is incident on the diode for the photosensor and (ii) a case where light is incident on the diode for the photosensor. Setting an appropriate gate voltage prevents a leakage current from occurring in the case where light is incident. Accordingly, the gate electrode 114 gives an effect of an electric field to the inside of the diode for the photosensor by using a capacitance generated in the insulating film 103. Note that a place where the gate electrode 114 is provided is outside a path through which light travels toward a photoreceptor, and is not related to blocking of light with respect to the photoreceptor.

FIG. 20 shows a cross-sectional configuration of a photosensor disclosed in Patent Literature 2.

This photosensor includes, on an insulating substrate 1, an N+ type semiconductor region 2, a P+ type semiconductor region 3, and an I type semiconductor region 4 formed on a part between the N+ type semiconductor region 2 and the P+ type semiconductor region 3. On the semiconductor region 4, an insulating layer 5 is formed. On the insulating layer 5, a control electrode 6 for controlling spectral characteristics is formed. The N+ type semiconductor region 2 is supplied with a positive electric potential (E+), and the type semiconductor region 3 is grounded. The control electrode 6 for controlling spectral characteristics is supplied with a spectral characteristics control voltage Vg.

Applying the spectral characteristics control voltage Vg to the control electrode 6 changes an effect of an electric field which effect is given to the inside of the photosensor. This changes an electric potential distribution inside the photosensor, thereby changing the spectral characteristics. The technique disclosed in Patent Literature 2 also utilizes an effect of an electric field by using the control electrode 6, the effect being obtained by a capacitance generated in the I type semiconductor region 4. Note that a place where the control electrode 6 is provided is outside a path through which light travels toward a photoreceptor, and is not related to blocking of light to the photoreceptor.

Each of (a) and (b) of FIG. 21 shows a cross-sectional configuration of a photosensor disclosed in Patent Literature 3.

A photosensor 11 shown includes a PIN diode. The PIN diode is made of a polycrystalline Si film 21, and is formed on a glass substrate 14, on which a TFT is also formed. A PIN conjunction is made of (i) a region 21b, which is a p+ layer, (ii) a region 21c, which is an n+ layer, and (iii) a region 21a, which is an i layer. Further, a gate insulating film 15 and a first inter-layer insulating film 17 are formed so as to cover the polycrystalline Si layer 21. Furthermore, on the first inter-layer insulating film 17, a p electrode 33 and an n electrode 34 are formed. The p electrode 33 is electrically connected with the p+ region 21b of the polycrystalline Si 21 via a contact hole made through the first inter-layer insulating film 17 and the gate insulating film 15; the n electrode 34 is electrically connected with the n+ region 21c via a contact hole made through the first inter-layer insulating film 17 and the gate insulating film 15.

In (a) of FIG. 21, a protective film 24 is provided so as to cover an upper layer of the photosensor 11 i.e., the p electrode 33 and the n electrode 34, and a part of a surface of the first inter-layer insulating film 17 which part is in the vicinity of the p electrode 33 and the n electrode 34. The protective film 24 has (i) transparency with respect to a wavelength band of light received by the photosensor 11 and (ii) resistance to ultraviolet rays. A material of the protective film 24 may be, for example, a fluorocarbon resin, a silicon resin, an epoxy resin, or an acrylic resin. In (b) of FIG. 21, the protective film 24 is formed so as to cover at least a part through which light enters the photosensor 11.

As described above, Patent Document 3 discloses the technique for forming, on an electrode of a photosensor, an insulating protective film for preventing degradation of the characteristics of the sensor.

The liquid crystal display device 250 having the foregoing configuration has the following problems:

Since each of the detecting device 201 and the reference device 202 having the configuration shown in FIG. 16 is provided with the shield 407, a noise occurring on the display surface side is shielded. However, an electric field mainly caused by factors related to operation of the liquid crystal display device 250 (e.g., a change in an electric potential of the counter electrode 332 and a change an electric potential of a data signal) goes around the detecting device 201 and the reference device 202, so as to reach the PIN photodiode 413 from the glass substrate 314 side. This generates inductive noise therein. In addition to this, a noise (e.g., electromagnetic waves, radiation, and buzzing) generated in a backlight may be another source of the inductive noise reaching the PIN photodiode 413 from the glass substrate 314 side. Further, in a case where the electric potential of the light shield 204 provided behind the PIN photodiode 413 is floating, the floating electric potential causes an unstable output current of the PIN photodiode 413.

This inductive noise is transmitted to the operational amplifier 205 via the wiring L2 and the wiring L4 as a common mode noise. However, unlike inter-substrate wiring, wiring 265 including the wiring L2 and the wiring L4 is manufactured by a thin-film process, and is formed so as to be a long path running through the picture-frame region of the display panel 251, as shown in FIG. 14. Therefore, the wiring 265 has a great resistance. Further, there is a parasitic capacitance with its surroundings. That is, there are parasitic elements, which are not circuit elements shown in FIG. 10, and impedances of the parasitic elements vary depending on the frequency. Therefore, in consideration of the fact that the change in the electric potential is made of fundamental wave components and harmonic components thereof, it is difficult to set conditions of a balanced circuit for attenuating the common mode noise with respect to each frequency. Furthermore, the wiring L2 and the wiring L4 are manufactured, by means of a photolithographic process, on the substrate whose area is far larger than that of an IC chip or the like. This leads to variations of patterning size and film quality in a panel surface and variations made for each production lot, thereby making it further difficult to set the conditions of the balanced circuit. Moreover, it is necessary to consider, in removing the common mode noise, the fact that a CMRR (common mode rejection ratio) of the operational amplifier 205 with respect to a high frequency component is low. This makes the measure complicated.

As a result, as indicated by the curved line c4 of FIG. 17, the output voltage Vo of the operational amplifier 205 included in the ambient light sensor changes while being affected by a vibration error mainly caused by the common mode noise. This prevents the integration from being carried out linearly, thereby causing a voltage of the point P2, which includes an error, to be held at the end of the integration period. Assume that a comparator included inside the A/D converter 210 has, for example, a threshold value of 80 mV for determining a certain quantization level. In this case, a quantization result obtained with a held voltage at the point P1 and a quantization result obtained with a held voltage at the point P2 are different. This causes an error in detection of an intensity of ambient light AL. Thus, there is such a problem that an intensity of ambient light AL cannot be detected accurately in a case where inductive noise occurs in the PIN photodiodes 413.

(2) There is also a problem with respect to the wiring 256. Specifically, assume that, as well as the PIN photodiodes 413, the wiring 265 is provided with a shield against an electric field which shield is formed by using a layer where the pixel electrode 307 of the matrix display section 261 is provided. However, even with this configuration, in a case where inductive noise occurs from the glass substrate 314, it is impossible to accurately detect an intensity of ambient light AL.

(3) As shown in FIG. 16, the light shield 204 is provided for each PIN photodiode 413 of the detecting device 201 and for each PIN photodiode 413 of the reference device 202. However, it is difficult for the light shield 204 to completely block the backlight light B/L, and therefore some amount of stray light reaches the PIN photodiode 413. In FIG. 14, the detecting device 201 and the reference device 202 are arranged so as to be symmetric to each other with respect to a vertical center line of the display panel 251. Therefore, the stray light is likely to reach the detecting device 201 and the reference device 202 equally. However, the characteristics of the PIN photodiodes 413 vary in the panel surface and according to the production lot. Therefore, even in a case where the stray light reaches the detecting device 201 and the reference device 202 equally, it is difficult for the detecting device 201 and the reference device 202 to have the same bias condition.

In the configuration shown in FIG. 10, since each of the detecting device 201 and the reference device 202 is made of the series connection of the PIN photodiodes 413, it is possible to absorb to some degree the variations of the PIN photodiodes which variations are made in manufacturing thereof. However, as the number of series connections and/or the number of parallel connections are increased and thereby the number of PIN photodiodes is increased, an area occupied by the PIN photodiodes also increases, thereby making the variations in the characteristics greater. That is, in the case where the variations in the characteristics of the PIN photodiodes are significantly large, it is impossible to sufficiently absorb the variations in the characteristics even by increasing the number of series connections. Thereby, as indicated by the straight line c5 in FIG. 17, the output voltage Vo of the operational amplifier 205 is shifted from the straight line c3 and held at a voltage of the point P3. This arises such a problem that it is difficult to accurately detect an intensity of ambient light AL.

The present invention was made in view of the foregoing problem (1), and an objective of the present invention is to realize a display device in which inductive noise for a photoelectric conversion device used for an ambient light sensor is further reduced.

In order to solve the foregoing problem, a display device of the present invention includes: a display panel; and an ambient light sensor which detects an intensity of ambient light on a display surface side of the display panel in response to photoelectric conversions made by at least one photoelectric conversion device provided in the display panel, said display device adjusting a luminance of display on the display surface in accordance with the intensity of the ambient light which intensity is detected by the ambient light sensor, said display device further including: a light shield against stray light, provided in the display panel so as to be closer to a back surface side of the display panel than said at least one photoelectric conversion device is, the light shield being made of a conductive material, and a predetermined electric potential being applied to the light shield.

According to this invention, the light shield against stray light is provided in the display panel so as to be closer to the back surface side of the display panel than the photoelectric conversion device is, and the light shield is made of the conductive material. Further, the predetermined electric potential is applied to the light shield against stray light. This allows the light shield against stray light to function also as a shield against an electric field. Accordingly, it possible to prevent noise induction with respect to the photoelectric conversion device, the noise induction occurring from the back surface side of the display panel. Further, this prevents the following situation: The light shield becomes floating, and this causes the characteristics of the photoelectric conversion device (e.g., the diode characteristics) to be unstable.

Thus, it is possible to realize a display device in which inductive noise for a photoelectric conversion device used for an ambient light sensor is further reduced.

Further, since the light shield against stray light also serves as the shield against an electric field, it is possible to reduce the number of additional members that are used for providing a shield against an electric field.

In order to solve the foregoing problem, in the display device of the present invention, the ambient light sensor is configured such that: said at least one photoelectric conversion device has two current output terminals, and one of the two current output terminals is connected with a power source supplying a reference electric potential; and an electric potential is supplied to the other one of the two current output terminals, the electric potential being set to be equal to the predetermined electric potential.

According to this invention, the one of the current output terminals of the photoelectric conversion device is connected with the power source supplying the reference electric potential. Therefore, in a case where said the other one of the current output terminals obtains an electric potential determined on the basis of the reference electric potential and in accordance with an output from the photoelectric conversion device, the electric potential thus obtained is equal to the electric potential applied to the light shield against stray light. This prevents the electric potential from being changed due to a parasitic capacitance generated between the light shield against stray light and the other one of the current output terminals. This makes it possible to stabilize the electric potential of said the other one of the current output terminals of the photoelectric conversion device.

In order to solve the foregoing problem, in the display device of the present invention, the ambient light sensor is configured such that: said at least one photoelectric conversion device is (i) a first photoelectric conversion device on which the ambient light is incident and (ii) a second photoelectric conversion device, having a same configuration as that of the first photoelectric conversion device, which is in an environment in which light having a reference brightness is incident; and the second photoelectric conversion device generates an open circuit voltage which is applied to the first photoelectric conversion device as a bias voltage, and the ambient light sensor detects the intensity of the ambient light in accordance with a current outputted from the first photoelectric conversion device.

According to this invention, the bias voltage equal to the open circuit voltage generated by the second photoelectric conversion device (i.e., the open circuit voltage applied to the first photoelectric conversion device) is used to cause the light shield against stray light to have the same electric potential as that of said the other one of the current output terminals. This greatly contributes to accurate detection of an intensity of ambient light.

In order to solve the foregoing problem, in the display device of the present invention, said at least one photoelectric conversion device is configured to include a plurality of photoelectric conversion device elements, each having a same configuration, which are connected in series.

According to this invention, the open circuit voltage generated by the second photoelectric conversion device is the sum of open circuit voltages of the photoelectric conversion device elements. Thanks to this, an error hardly occurs in detection of a current outputted from the first photoelectric conversion device. Therefore, causing the light shield against stray light to have the same electric potential as that of said the other one of the current output terminals so that the open circuit voltage is stably supplied to the first photoelectric conversion device greatly contributes to accurate detection of an intensity of ambient light.

In order to solve the foregoing problem, in the display device of the present invention, said at least one photoelectric conversion device is configured to include a plurality of series circuits connected in parallel with each other, the plurality of series circuits each having at least one photoelectric conversion device element of same number and of same configuration.

According to this invention, the plurality of series circuits having at least one photoelectric conversion device element are connected in parallel with each other. This increases a current outputted from the photoelectric conversion device per unit amount of incident light, thereby improving detection accuracy of the intensity of the ambient light.

In order to solve the foregoing problem, in the display device of the present invention, said at least one photoelectric conversion device includes a single photoelectric conversion device element or a combination of photoelectric conversion device elements, each of the photoelectric conversion device element(s) being made of a PIN photodiode.

With this invention, in the ambient light sensor using the PIN photodiode, which is easy to be formed on the display panel monolithically, it is possible to reduce the inductive noise for the PIN photodiode.

In order to solve the foregoing problem, in the display device of the present invention, the PIN photodiode is a lateral PIN photodiode.

With this invention, in the ambient light sensor using the lateral PIN photodiode, which is suitably formed on the display panel monolithically (especially in terms of its process), it is possible to reduce the inductive noise for the lateral PIN photodiode.

In order to solve the foregoing problems, in the display device of the present invention, said at least one photoelectric conversion device includes a single photoelectric conversion device element or a combination of photoelectric conversion device elements, each of the photoelectric conversion device element(s) being made of a phototransistor.

With this invention, in the ambient light sensor using the phototransistor, it is possible to reduce the inductive noise for the phototransistor.

In order to solve the foregoing problem, in the display device of the present invention, the display panel is a thin film transistor liquid crystal panel; and said at least one photoelectric conversion device is formed in a picture-frame region of a substrate of a thin film transistor and in a layer where an activating layer of the thin film transistor is provided.

With this invention, it is possible to easily manufacture the photoelectric conversion device by using a process for the TFT liquid crystal panel.

In order to solve the foregoing problem, in the display device of the present invention, the light shield is formed, in the picture-frame region, below a layer where a gate electrode of the thin film transistor is provided, in a direction in which layers of the thin film transistor are stacked, said display device further including: a first connecting electrode, connected with the light shield, which is provided in the picture-frame region and is formed in the layer where the gate electrode is provided; and a second connecting electrode, connected with the first connecting electrode, which is provided in the picture-frame region and is formed in a layer where a source electrode of the thin film transistor is provided, the second connecting electrode being connected with the power source supplying the predetermined electric potential.

With this invention, it is possible to easily manufacture, by using a process for the TFT liquid crystal panel, wiring for supplying the predetermined electric potential to the light shield against stray light.

In order to solve the foregoing problem, the display device of the present invention further includes a shield against an electric field which shield is provided in the display panel so as to be closer to the display surface side of the display panel than said at least one photoelectric conversion device is.

According to this invention, the shield against an electric field is also provided in the display panel so as to be closer to the display surface side of the display panel than the photoelectric conversion device is. This significantly reduces the inductive noise for the photoelectric conversion device.

In order to solve the foregoing problem, the display device of the present invention further includes a shield against an electric field, provided in the display panel so as to be closer to the display surface side of the display panel than said at least one photoelectric conversion device is, which shield is formed in a layer where a pixel electrode is formed.

With this invention, it is possible to easily manufacture, by using a process for the TFT liquid crystal panel, the shield against an electric field which shield is provided in the display panel so as to be closer to the display surface side of the display panel than the photoelectric conversion device is.

In order to solve the foregoing problem, in the display device of the present invention, a luminance of a light source of a backlight is adjusted in accordance with the intensity of the ambient light which intensity is detected by the ambient light sensor so that the luminance of the display on the display surface is adjusted.

With this invention, in the display device in which the luminance of the light source of the backlight is adjusted in accordance with the intensity of the ambient light, it is possible to reduce the inductive noise for the photoelectric conversion device.

In order to solve the foregoing problem, in the display device of the present invention, the predetermined electric potential is supplied from said the other one of the two current output terminals.

With this invention, it is possible to easily apply the predetermined electric potential to the light shield against stray light.

For a fuller understanding of the nature and advantages of the invention, reference should be made to the ensuing detailed description taken in conjunction with the accompanying drawings.

BRIEF DESCRIPTION OF DRAWINGS

FIG. 2 is a cross section view illustrating a configuration of wiring of the ambient light sensor and the surroundings of the wiring.

FIG. 22 is a plan view specifically illustrating the example of the combination of (i) the arrangement of the ambient light sensor and (ii) the direction of the PIN photodiodes. (a) through (d) of FIG. 22 show different combinations.

REFERENCE SIGNS LIST 1 to 3 Display device
201 Detecting device (photoelectric conversion device, first photoelectric conversion device)
202 Reference device (photoelectric conversion device, second photoelectric conversion device)
204 Light shield
266a Power source voltage generating device (third photoelectric conversion device)
413 PIN photodiode (photoelectric conversion device element)
516 First shield electrode (shield electrode)
521 Second shield electrode (shield electrode)

507 Third shield electrode (shield electrode)
601 Fourth shield electrode (shield electrode)

DESCRIPTION OF EMBODIMENTS

One embodiment of the present invention is described below with reference to FIG. 1 through FIG. 7, and FIG. 22.

Figure 3:
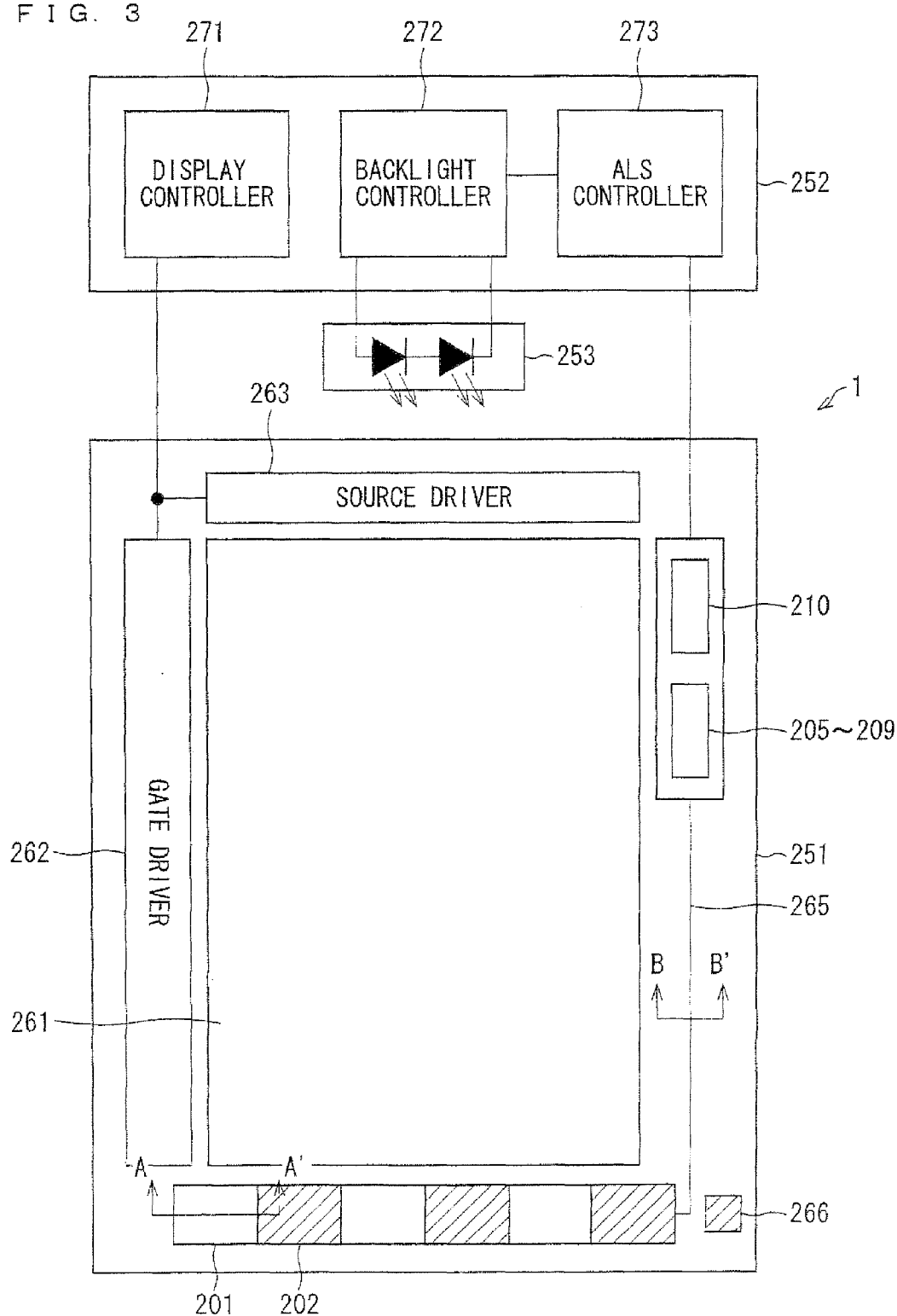
FIG. 3, related to an embodiment of the present invention, is a block diagram illustrating a first configuration of the display device.

FIG. 3 shows a liquid crystal display device 1 according to the present embodiment.

Figure 14:
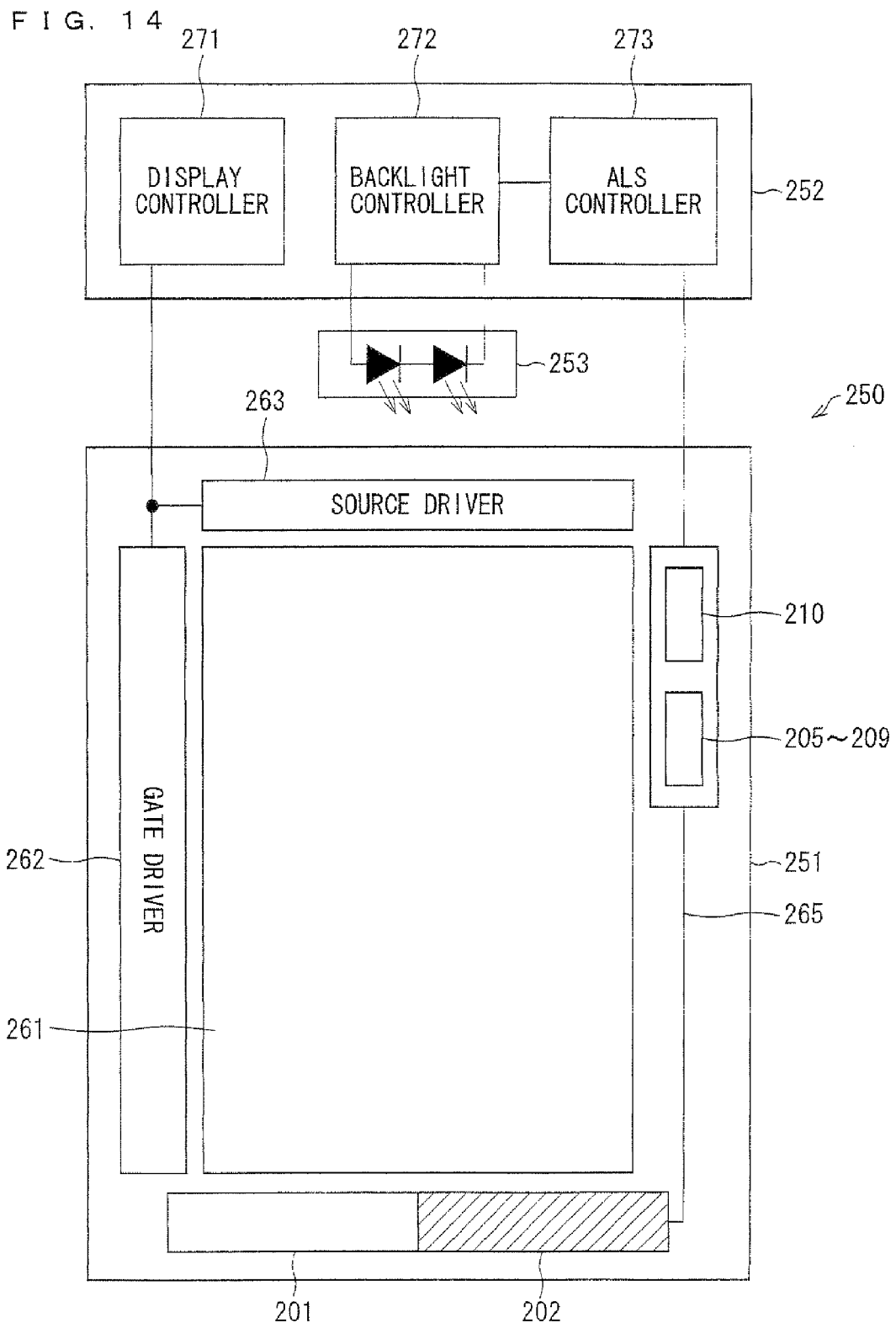
FIG. 14, related to conventional art, is a block diagram illustrating a configuration of a display device.

The liquid crystal display device 1 is realized by modifying the liquid crystal display device 250 illustrated in FIG. 14 in such a manner that (i) the layout and the respective configurations of the detecting device (first photoelectric conversion device) 201 and the reference device (second photoelectric conversion device) 202 of the ambient light sensor are changed, (ii) the configuration of the wiring 265 including the wiring connected with the detecting device 201 and the wiring connected with the reference device 202 is changed, and (iii) a power source circuit 266 is additionally provided. A pixel configuration of a matrix display section 261 is the same as that illustrated in FIG. 15.

Figure 4:
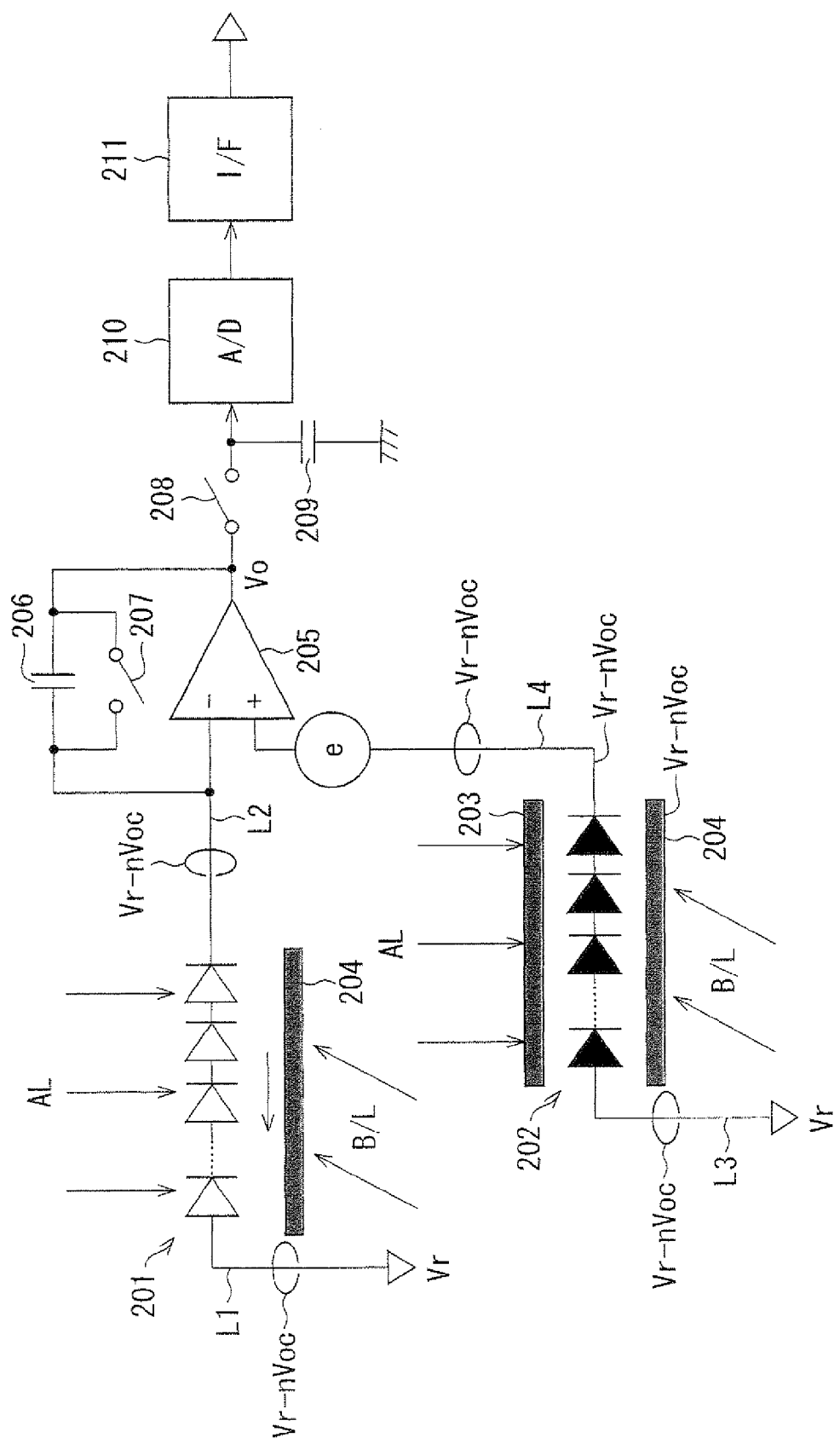
FIG. 4 is a circuit block diagram illustrating a configuration of the ambient light sensor.

FIG. 4 shows a configuration of an ambient light sensor of a liquid crystal display device 250 having the foregoing configuration.

Figure 10:
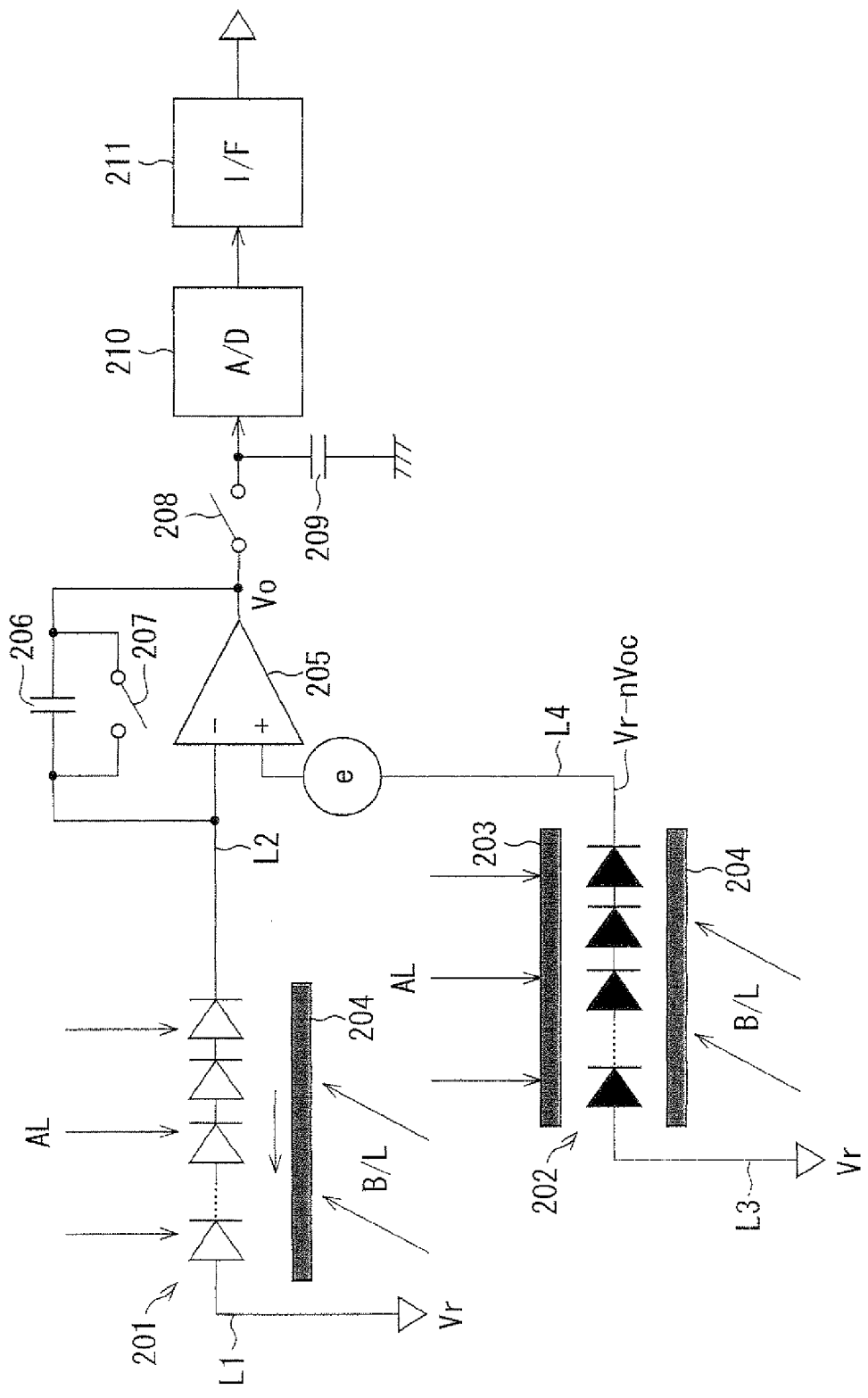
FIG. 10, related to conventional art, is a circuit diagram illustrating a second configuration of an ambient light sensor.
Figure 11:
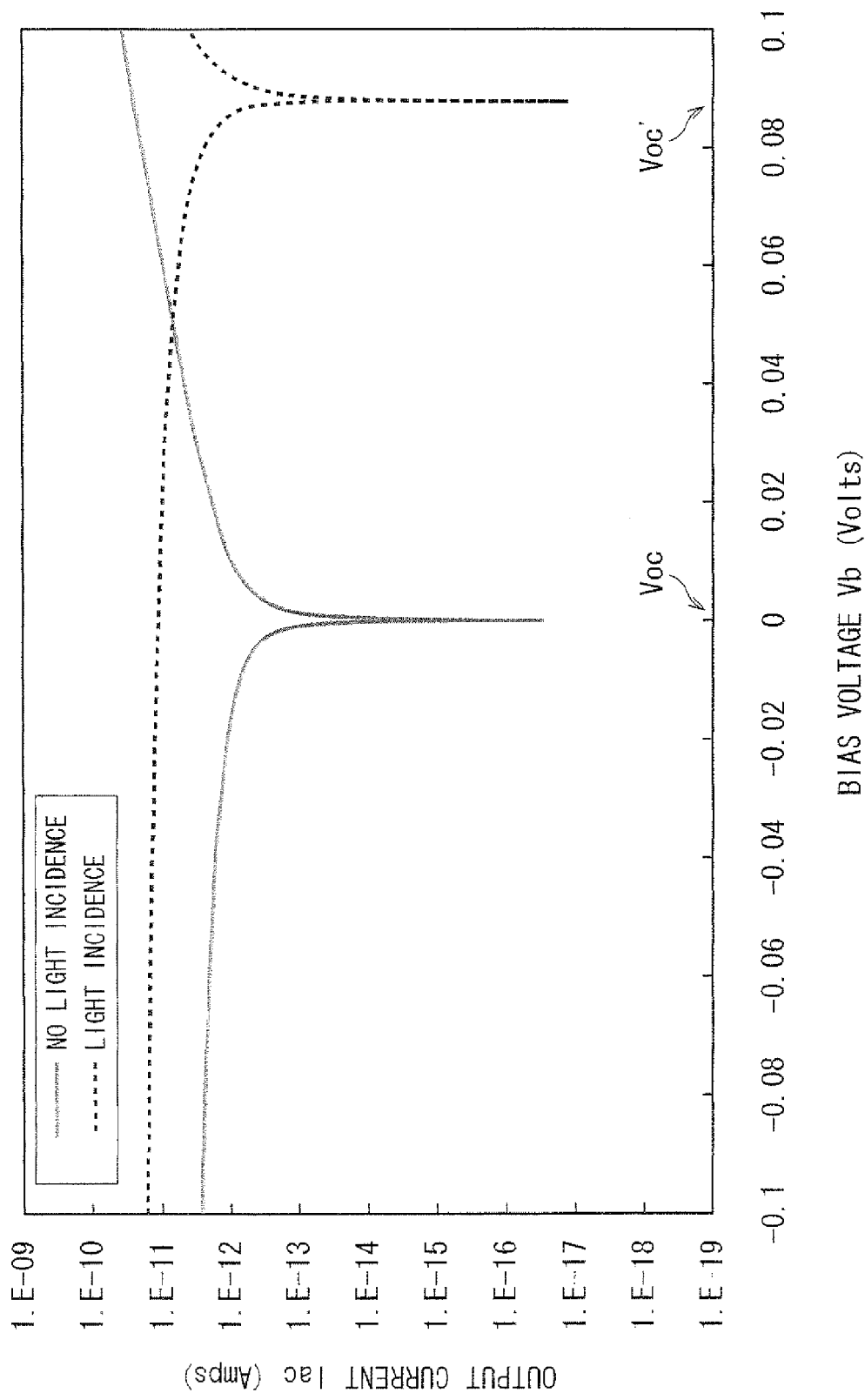
FIG. 11 is a second graph illustrating a relationship between an output current and a bias voltage with respect to one PIN photodiode.
Figure 12:
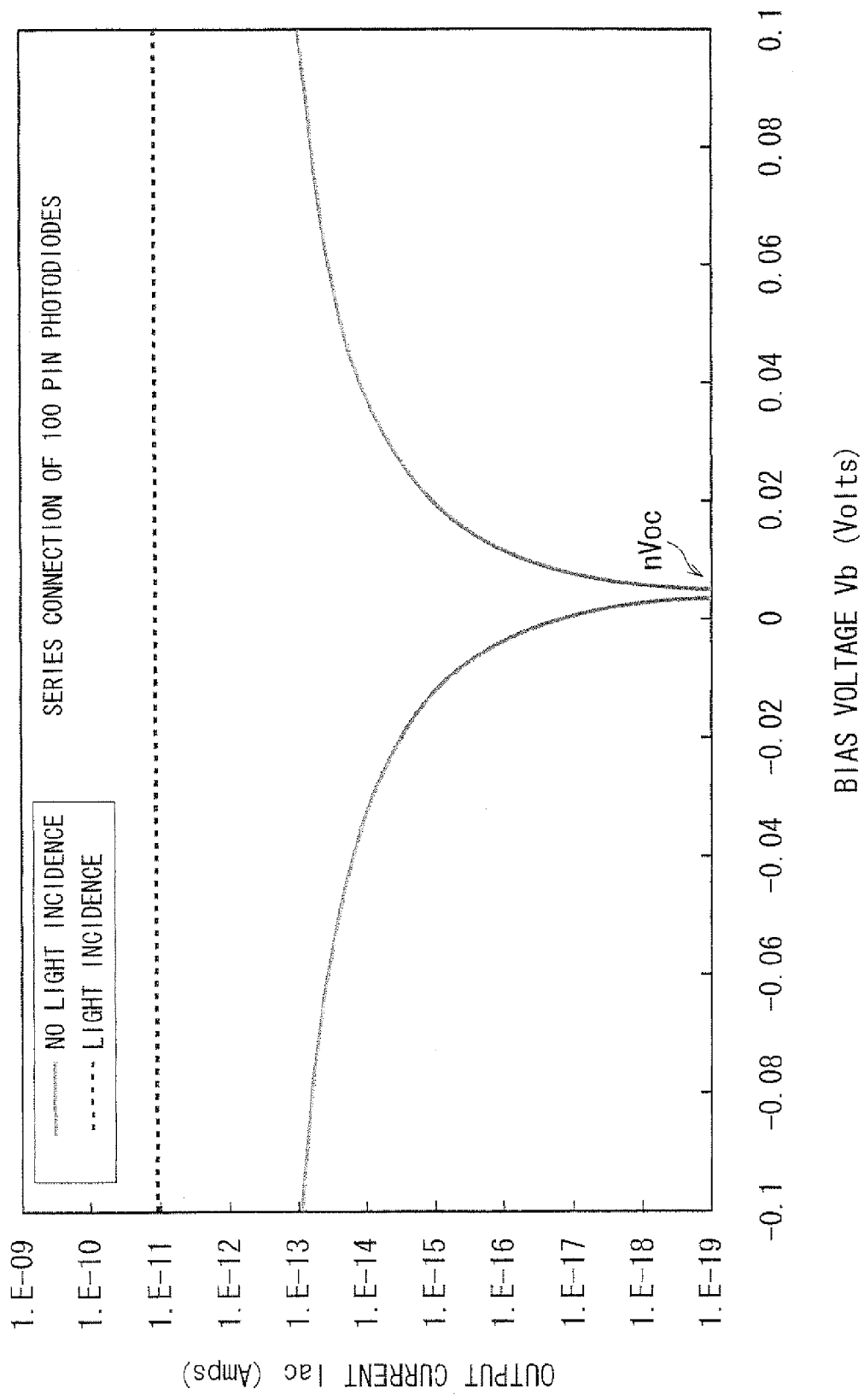
FIG. 12 is a first graph illustrating a relationship between an output current and a bias voltage which relationship is observed in a configuration in which a plurality of PIN photodiodes are connected in series.
Figure 13:
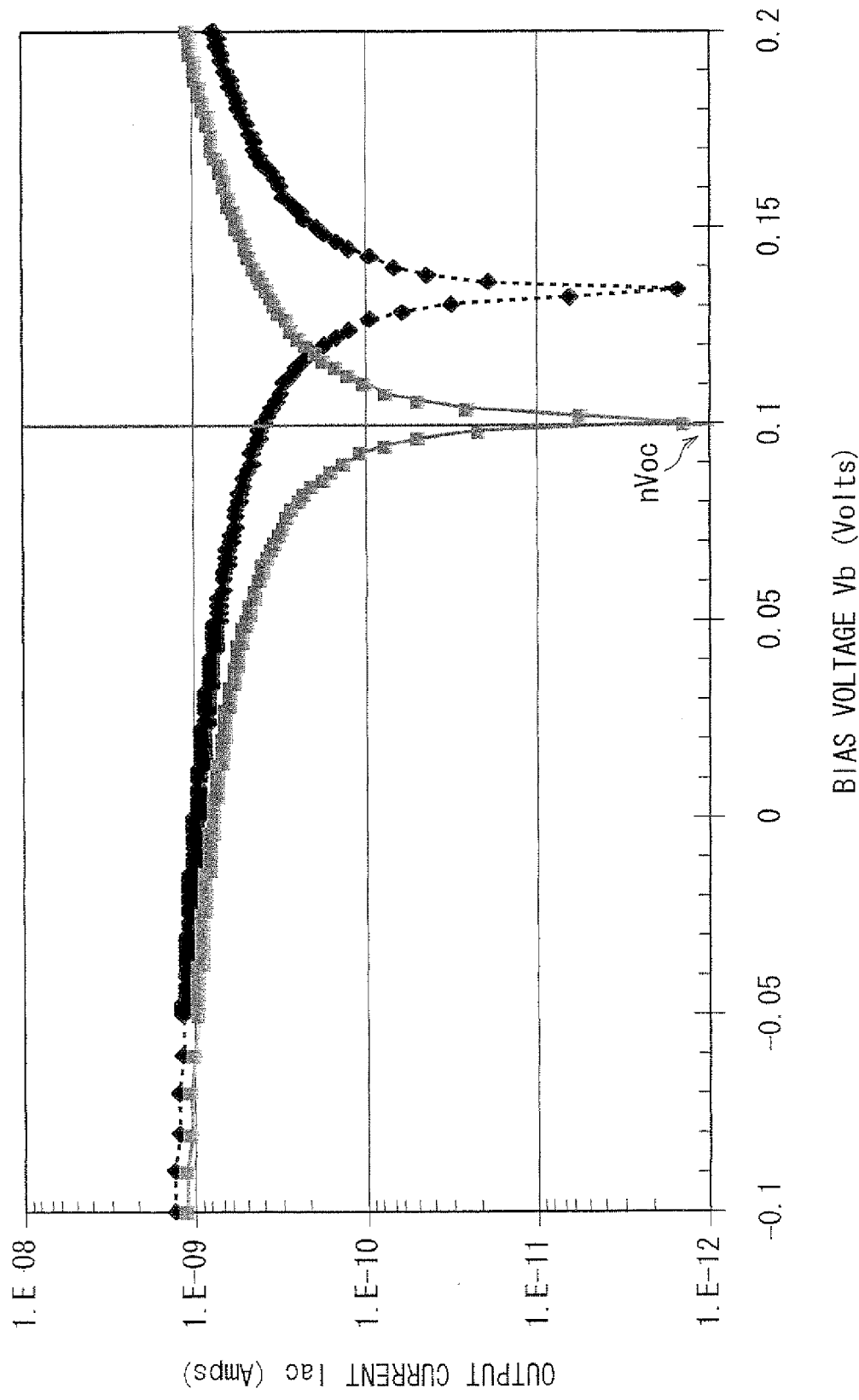
FIG. 13 is a second graph illustrating a relationship between an output current and a bias voltage which relationship is observed in a configuration in which a plurality of PIN photodiodes are connected in series.

This ambient light sensor is realized by modifying the ambient light sensor shown in FIG. 10 in such a manner that the light shield (the light shield against stray light) 204 is changed to be formed of a conductive film and to be connected with the power source circuit 266, which supplies a reference electric potential Vr−nVoc, so that the light shield 204 functions also as a shield against an electric field. Further, conductive films are provided so as to surround the wiring 265 including (i) wiring L1, supplying the reference electric potential Vr−nVoc, which is connected with an anode-side terminal (current output terminal) of the detecting device 201, (ii) wiring L2 which is connected with a cathode-side terminal (current output terminal) of the detecting device 201, (iii) wiring L3, supplying the reference electric potential Vr−nVoc, which is connected with an anode-side terminal (current output terminal) of the reference device 202, and (iv) wiring L4 which is connected with a cathode-side terminal (current output terminal) of the reference device 202, and are connected with the power source circuit 266. This configuration functions as a shield against an electric field.

Figure 1:
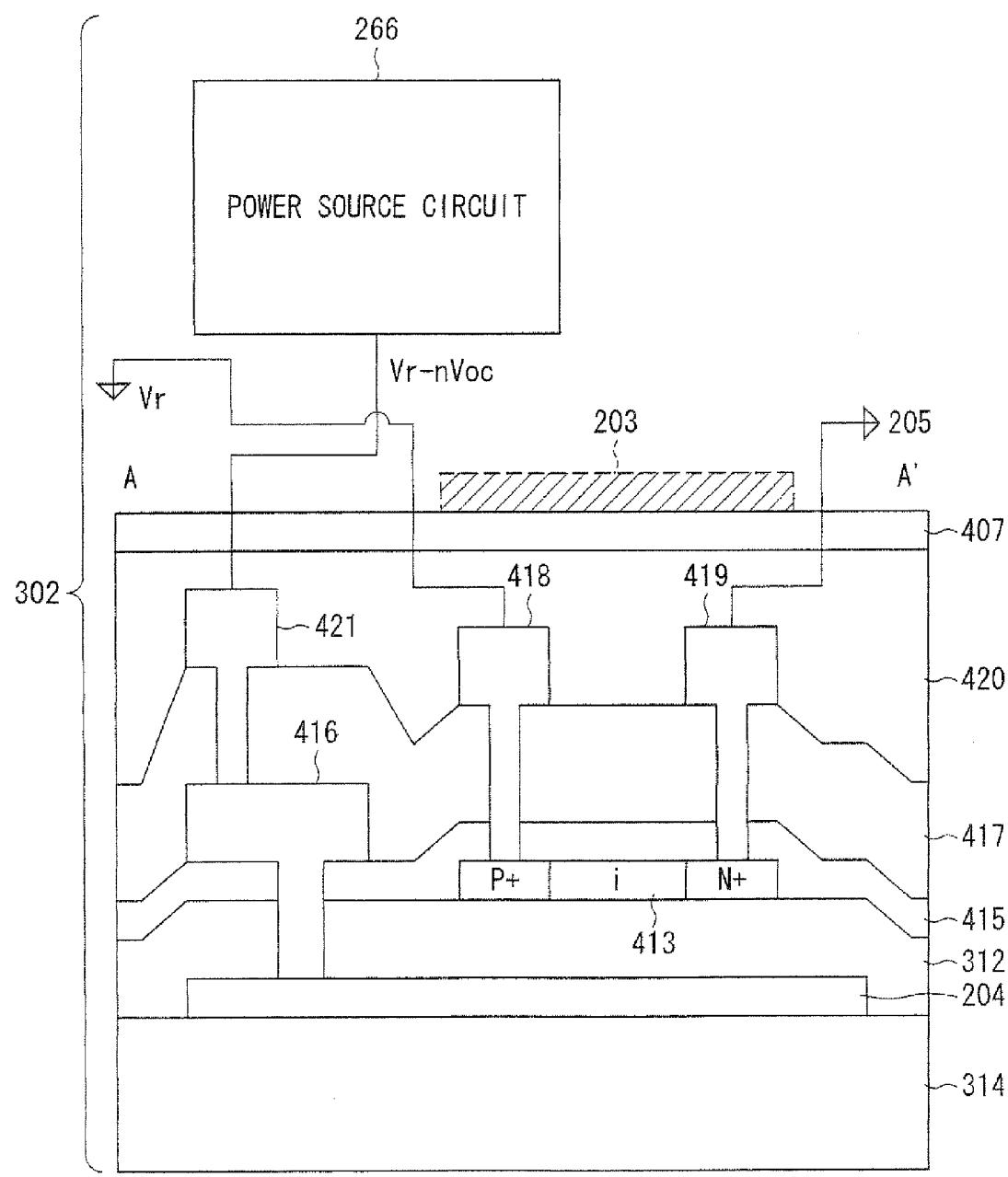
FIG. 1, related to an embodiment of the present invention, is a cross-section view illustrating a configuration of a PIN photodiode of an ambient light sensor provided in a display device and the surroundings of the PIN photodiode.

FIG. 1 shows a cross-section view of the detecting device 201 or the reference device 202 along the A-A' line.

Figure 15:
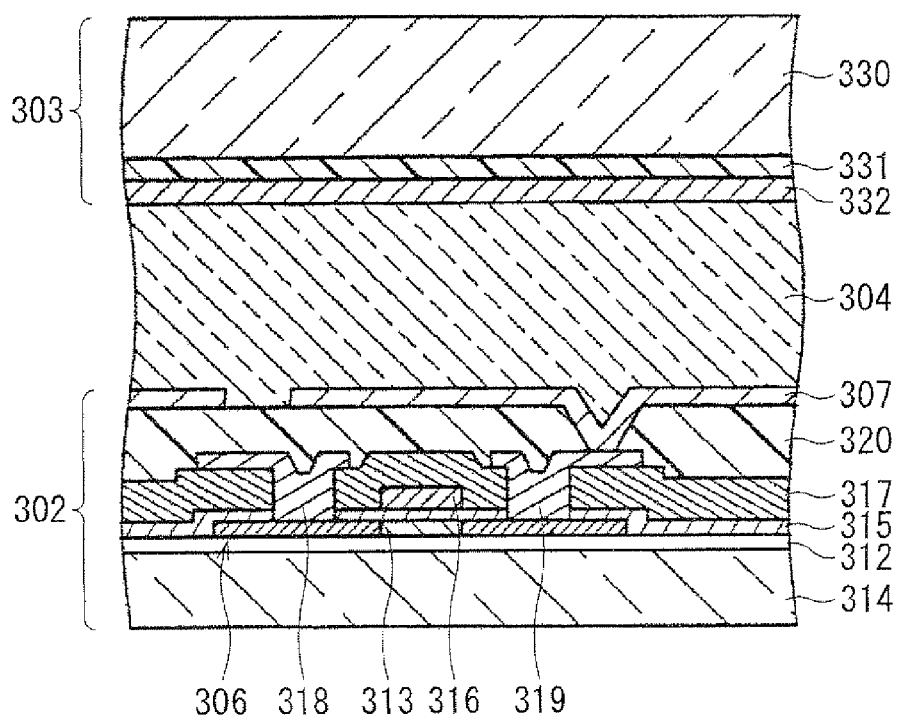
FIG. 15 is a cross-section view illustrating a configuration of a matrix display section included in the display device illustrated in FIG. 14.
Figure 16:
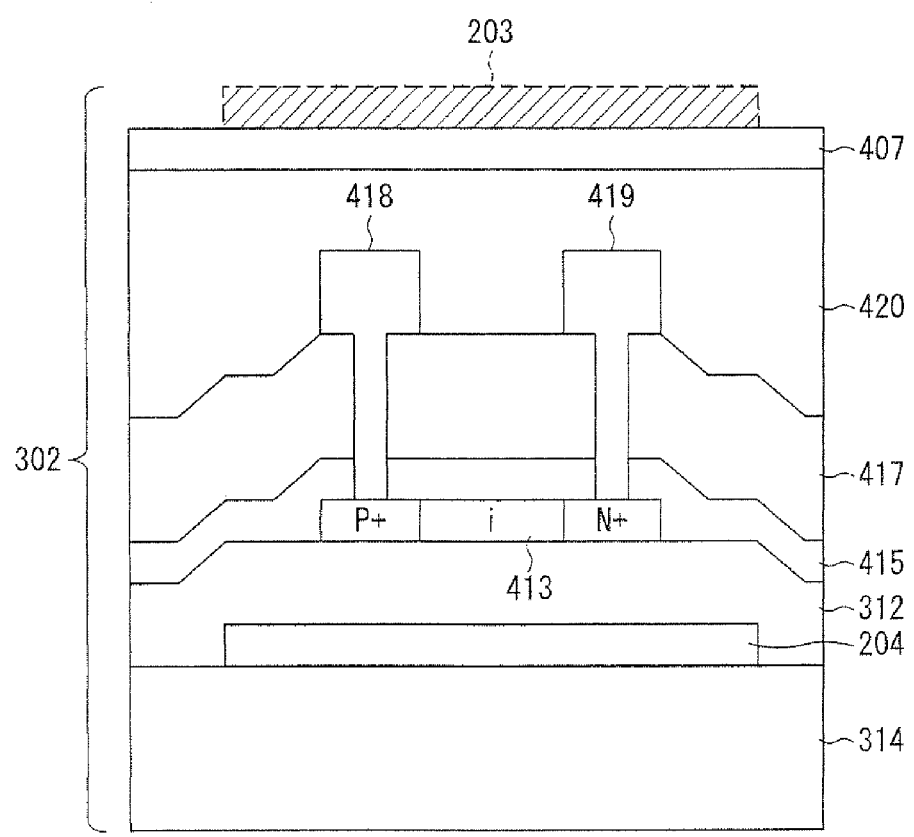
FIG. 16 is a cross-section view illustrating a configuration of a PIN photodiode of an ambient light sensor provided in the display device illustrated in FIG. 14 and the surroundings of the PIN photodiode.
Figure 17:
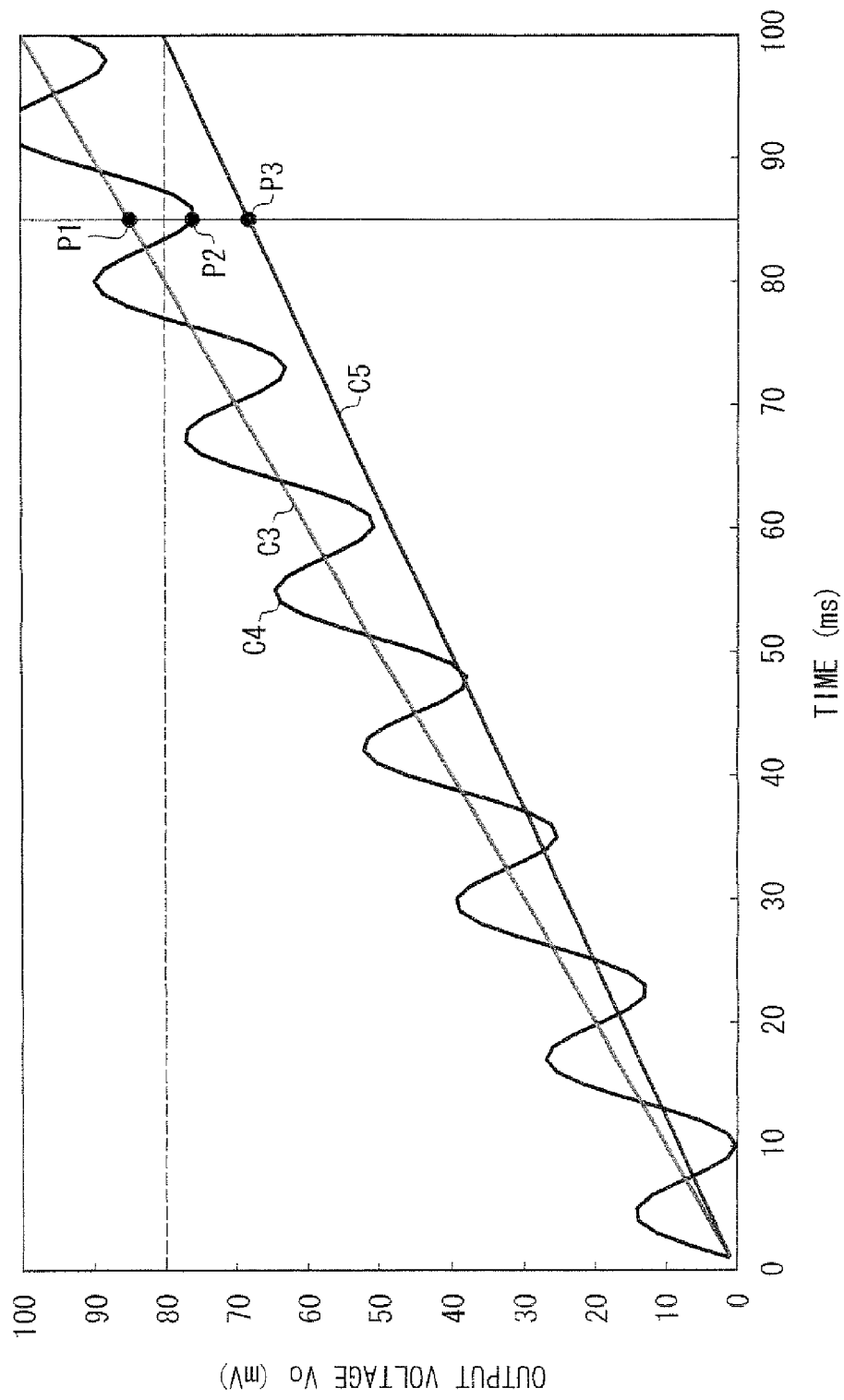
FIG. 17 is a graph illustrating a change of an output voltage with time, the output voltage being outputted from the ambient light sensor illustrated in FIG. 10.

A configuration shown in FIG. 1 is realized by modifying the configuration shown in FIG. 16 in such a manner that the light shield 204 is changed to be formed of a conductive film made to have a low transmittance. In consideration of an annealing process and an activating process, suitable examples of the conductive film encompass Mo or W, each of which is a metal having a high melting point. Alternatively, the conductive film may be made of the same material as that of the gate electrode 316, the source electrode 318, the drain electrode 319, and the like of the TFT 306 shown in FIG. 15. Further, a first connecting electrode 416 is provided on an insulating film 415, the first connecting electrode 416 being connected with the light shield 204 via a contact hole made through the insulating film 415 and a base coating 312. The first connecting electrode 416 may be formed by patterning using a layer where the gate electrode 316 of the TFT 306 is provided. Further, a second connecting electrode 421 is provided on an inter-layer insulating film 417, the second connecting electrode 421 being connected with the first connecting electrode 416 via a contact hole made through the inter-layer insulating film 417. The second connecting electrode 421 may be formed by patterning using a layer where the source electrode 318 and the drain electrode 319 of the TFT 306 are provided. The second connecting electrode 421 is connected with the power source circuit 266 (described later).

An anode electrode 418, which is the anode-side terminal, is connected with the wiring L1 or the wiring L3, each of which supplies an electric potential Vr; and a cathode electrode 419, which is the cathode-side terminal, is connected with the wiring L2 or the wiring L4, each of which is connected with an input terminal of an operational amplifier 205.

The power source circuit 266 is provided, for example as shown in FIG. 3, in the vicinity of (i) a part where the detecting device 201 and the reference device 202 are provided and (ii) the wiring 265. The power source circuit 266 generates the reference electric potential Vr−nVoc, and applies it to the second connecting electrode 421.

By causing the light shield 204 to have a predetermined electric potential as described above, it is possible to allow the light shield 204 to function also as a shield against an electric field. In this case, it is possible to terminate, at the light shield 204, an electric flux line of an electric field heading for the PIN photodiodes 413 from a glass substrate 314 side i.e., from a back surface side of a display panel. Further, since the light shield 204 is caused to have the function as the shield against an electric field, it is also possible to expect, to some degree, an effect as an electromagnetic shield.

Furthermore, it is possible to prevent such a situation that the light shield 204 becomes floating and thereby diode characteristics of the detecting device 201 and the reference device 202 become unstable.

The electric potential of the light shield 204 should not necessarily be the same as the electric potential of the cathode of the PIN photodiode 413. However, by causing these electric potentials to be the same electric potential, Vr−nVoc, as described above, a parasitic capacitance generated between the cathode and the light shield 204 is reduced. This prevents the electric potential of the cathode from being affected by the light shield 204 at all.

Figure 18:
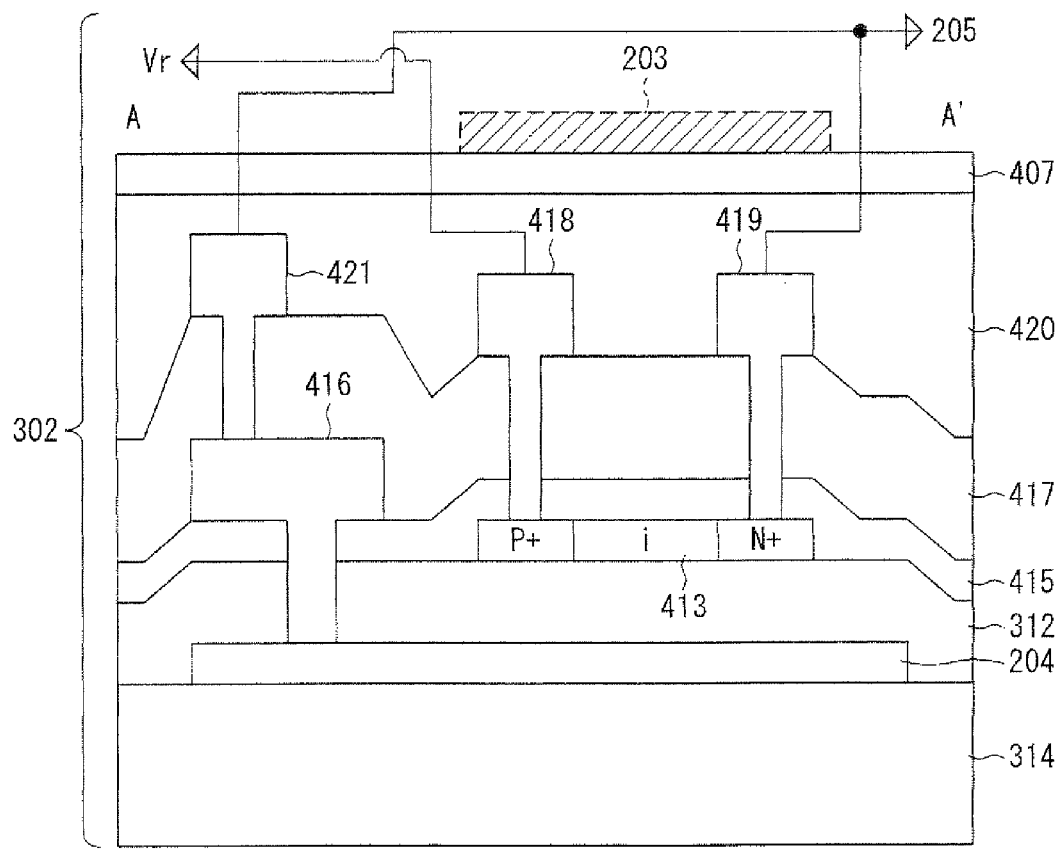
FIG. 18 is a cross section view illustrating a configuration of a variation of the ambient light sensor illustrated in FIG. 1.
Figure 19:
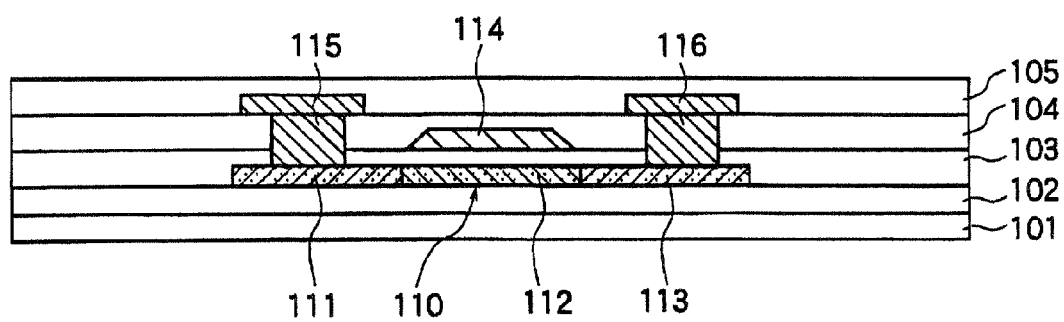
FIG. 19, related to conventional art, is a cross-section view illustrating a configuration of a diode for a photosensor.
Figure 20:
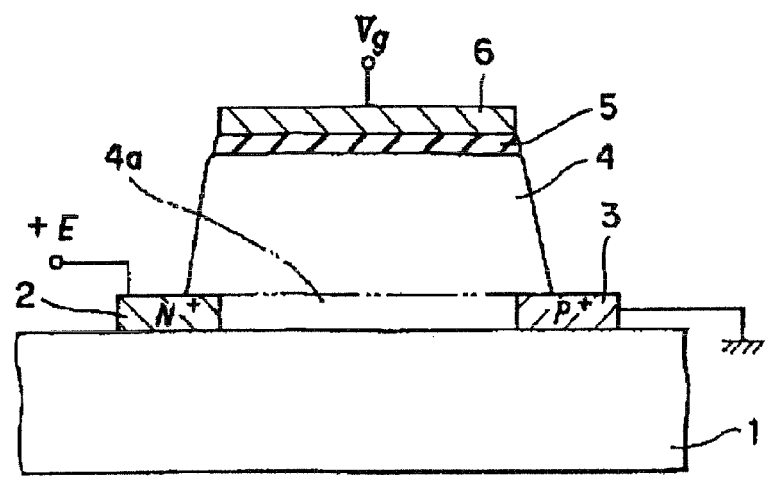
FIG. 20, related to conventional art, is a cross-section view illustrating a configuration of a photosensor.
Figure 21:
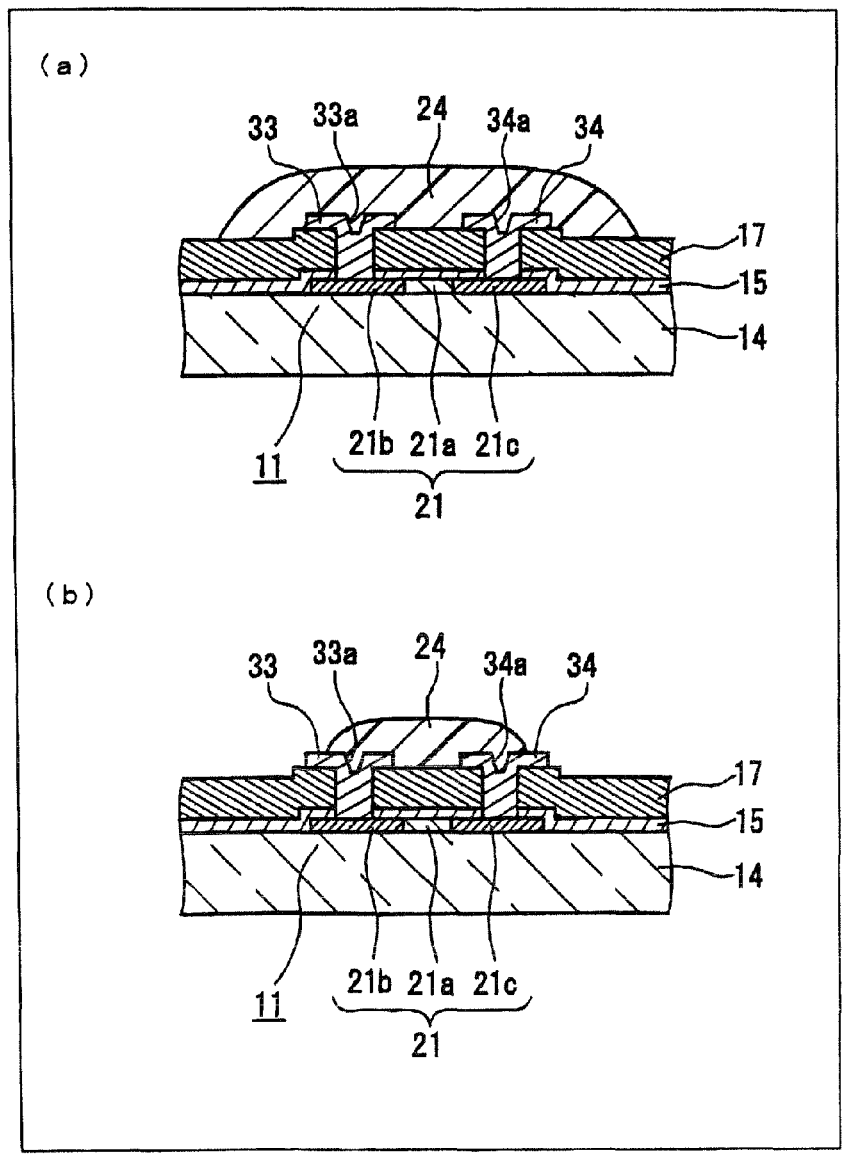
FIG. 21, related to conventional art, is a cross-section view illustrating a configuration of a photosensor.

Further, instead of the configuration in which the power source circuit 266 is provided as above, as shown in FIG. 18, the second connecting electrode 421 may be connected with the cathode electrode 419 of the reference device 202 so that the electric potential Vr−nVoc is supplied to the light shield 204.

FIG. 2 shows a cross-section view along the B-B' line of FIG. 3.

The cross-sectional configuration shown here is such that, on a glass substrate 314, the base coating 312, a first shield electrode 516, the inter-layer insulating film 417, the wiring 265 (L1, L2, L3, and L4), a second shield electrode 521, an inter-layer insulating film 420, and a third shield electrode 507 are stacked in order and formed by patterning. In a case where the liquid crystal display device 250 is capable of display in a reflective mode, a fourth shield electrode 601 may also be provided.

The first shield electrode 516 is provided at least below the wiring 265, that is, the first shield electrode 516 is provided in the display panel so as to be closer to a back surface side of the display panel than the wiring 265 is. The first shield electrode 516 may be formed in a layer where the gate electrode 316 of the TFT 306 shown in FIG. 15 is provided. Further, the reference electric potential Vr−nVoc is supplied to the first shield electrode 516 by the above-mentioned power source circuit 266. The wiring 265 and the second shield electrode 521 may be formed of a layer where the source electrode 318 and the drain electrode 319 of the TFT 306 are provided. The wiring 265 is provided so as to be sandwiched between the second shield electrodes 521. Here, in the wiring 265, the wiring L2 and the wiring L4 are provided in outer sides, the wiring L1 is provided in an inner side adjacent to the wiring L2, and the wiring L3 is provided in an inner side adjacent to the wiring L4. The second shield electrode 521 is connected with the first shield electrode 516 via a contact hole made through the inter-layer insulating film 417.

The third shield electrode 507 is provided at least above the wiring 265. The third shield electrode 507 may be formed in a layer where the pixel electrode 307 shown in FIG. 15 is provided. The third shield electrode 507 is connected with the second shield electrode 521 via a contact hole made through the inter-layer insulating film 420. In the case where the fourth shield electrode 601 is provided, the fourth shield electrode 601 may be provided so as to contact the third shield electrode 507 in an area as large as possible. Further, the fourth shield electrode 601 may be formed on the third shield electrode 507, and may be formed in a layer where a reflective electrode is provided.

According to this configuration, the wiring 265 is sandwiched between the first shield electrode 516 and the third shield electrode 507 (and the fourth shield electrode 601) vertically, and is sandwiched between the second shield electrodes 521 laterally. Especially, by providing the first shield electrode 516, it is possible to terminate, at the first shield electrode 516, an electric flux line of an electric field heading for the wiring 265 from the glass substrate 314 side. Since these shield electrodes are all caused to have the electric potential Vr−nVoc by the power source circuit 266, the shield electrodes provide a great shielding effect. This significantly reduces inductive noise for the wiring 265 which inductive noise is caused by an electric field. Further, in a case where (i) the contact hole through which the second shield electrode 521 is connected with the first shield electrode 516 and (ii) the contact hole through which the third shield electrode 507 is connected with the second shield electrode 521 are provided so as to cover, as much as possible, gaps between the wiring 265 and respective of the shields which gaps are beside the wiring 265, the wiring 265 is surrounded by the shield electrodes completely. This improves the shielding effect significantly.

Since the electric potentials of the shield electrodes are caused to be equal to the electric potentials of the wiring L2 and the wiring L4, a parasitic capacitance generated between (i) the wiring L2 and the wiring L4 and (ii) the shield electrodes is reduced.

Further, instead of the configuration in which the power source circuit 266 is provided as above, such a configuration is also possible that the first shield electrode 516, the second shield electrode 521, the third shield electrode 507, and the fourth shield electrode 601 are supplied with the electric potential Vr−nVoc from the cathode electrode 419 of the reference device 202, as well as in the configuration shown in FIG. 18.

Next, the following describes the layout of the detecting device 201 and the reference device 202 in the liquid crystal display device 1.

As shown in FIG. 3, in the liquid crystal display device 1, (i) first regions where the respective detecting devices 201 are provided and (ii) second regions where the respective reference devices 202 are provided are separately provided so as to be alternated along a picture-frame. In each region, a predetermined number of PIN photodiodes 413 are connected in series and in parallel. In the whole of the first regions, (i) a series connection of n PIN photodiode(s) and (ii) a predetermined number of parallel connections are provided. Also, in the whole of the second regions, (i) a series connection of n PIN photodiode(s) and (ii) a predetermined number of parallel connections are provided. The "n" may be 1, or 2 or more. Also, the number of parallel connections may be 1, or more than 1. Thereby, an average of the characteristics of the respective first regions is obtained as representative characteristics of the detecting devices 201; an average of the characteristics of all of the respective second regions is obtained as representative characteristics of the reference devices 202. Therefore, even in a case where there is a great variation in the characteristics of the PIN photodiodes 413 in the panel surface, representative characteristics of the detecting devices 201 and representative characteristics of the reference devices 202 can be almost equalized. Further, even in a case where (i) the amounts of stray light reaching the first regions are different and (ii) the amounts of stray light reaching the second regions are different, an effect of the stray light given to the whole of the detecting devices 201 and an effect of the stray light given to the whole of the reference devices 202 are almost equalized. This makes it possible to reduce an error in detection of ambient light AL which error is caused by the difference in the amount of stray light, compared with in the configuration shown in FIG. 14.

Figure 5:
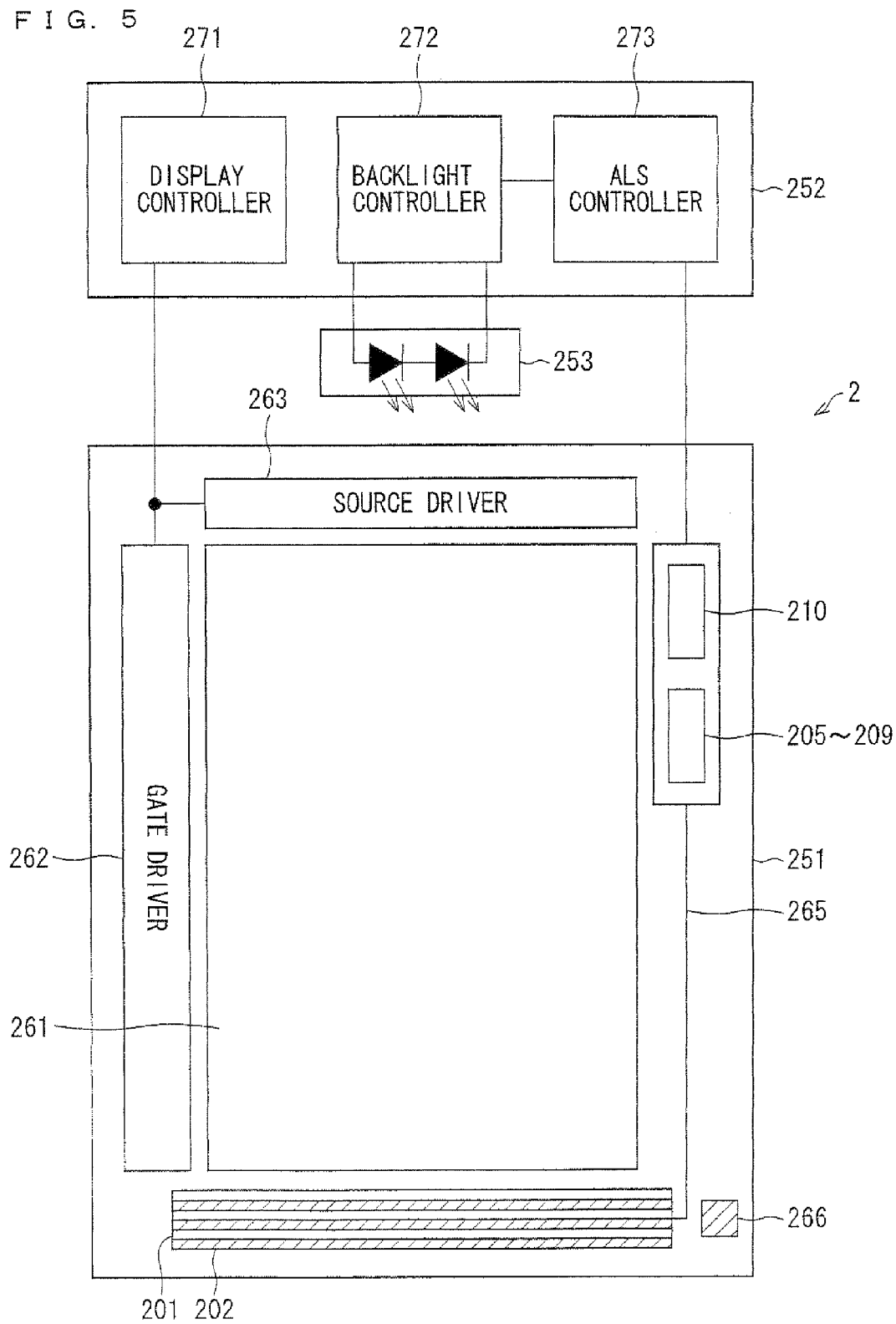
FIG. 5, related to an embodiment of the present invention, is a block diagram illustrating a second configuration of the display device.

FIG. 5 shows a liquid crystal display device 2 in which the detecting device 201 and the reference device 202 are arranged in another layout.

In the liquid crystal display device 2, first regions where respective detecting devices 201 are provided and second regions where respective reference devices 202 are provided are separately provided so as to be alternated along an orthogonal direction to a picture-frame. Also in this case, in each region, a predetermined number of PIN photodiodes 413 are connected in series and in parallel. In the whole of the first regions, (i) a series connection of n PIN photodiode(s) and (ii) a predetermined number of parallel connections are provided. Also, in the whole of the second regions, (i) a series connection of n PIN photodiode(s) and (ii) a predetermined number of parallel connections are provided. The "n" may be 1. Also with this layout, representative characteristics of the detecting devices 201 and representative characteristics of the reference devices 202 can be almost equalized. Further, as well as in the foregoing layout, it is possible to reduce the error in the detection of the ambient light AL which error is caused by the difference in the amount of stray light, compared with in the layout shown in FIG. 14.

Figure 6:
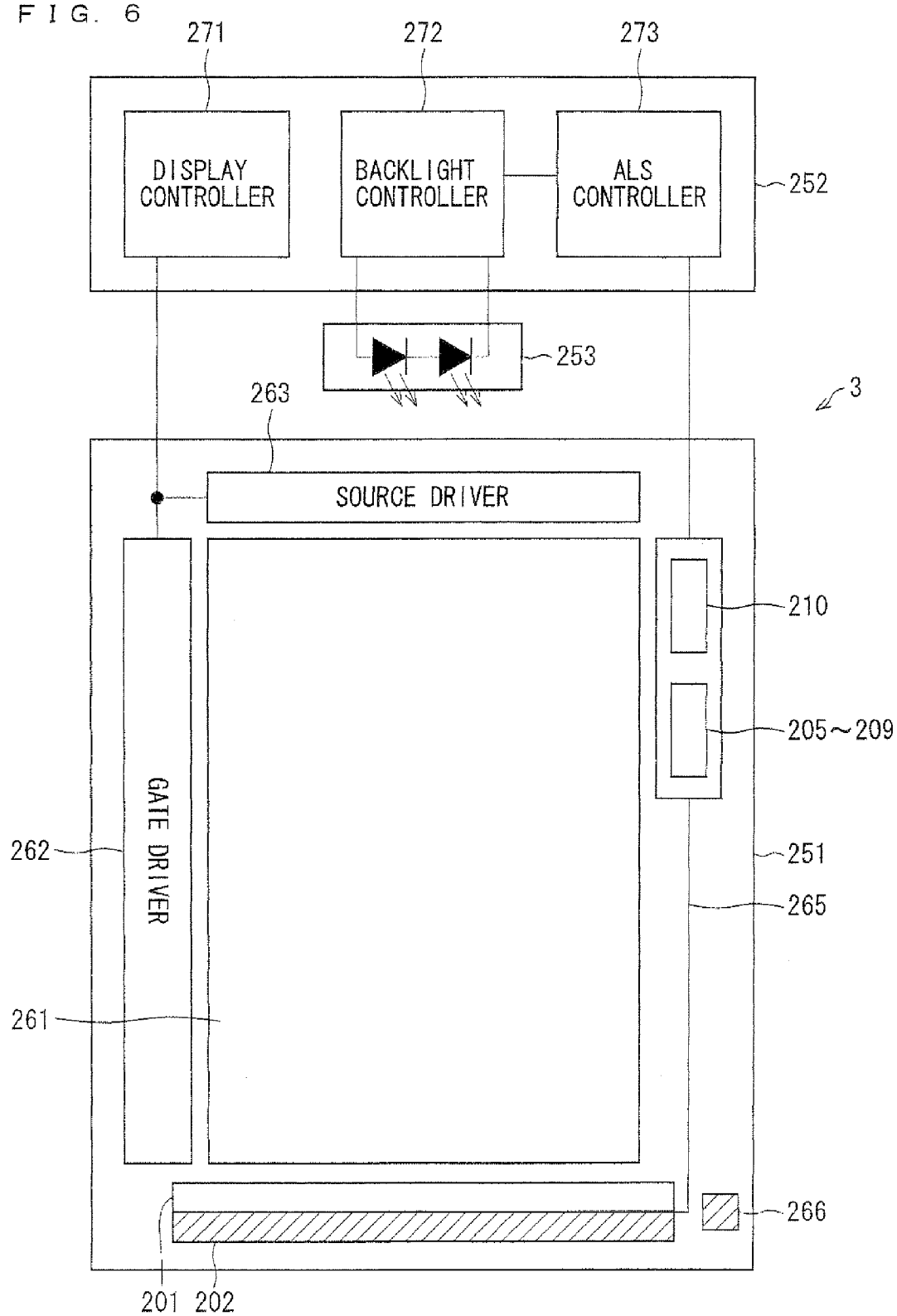
FIG. 6, related to a comparison example of the embodiment of the present invention, is a block diagram illustrating a third configuration of the display device.

FIG. 6 shows, as a comparison example, a liquid crystal display device 3 in which the detecting device 201 and the reference device 202 are arranged in further another layout.

In the liquid crystal display device 3, one first region where a detecting device 201 is provided and one second region where a reference device 202 is provided are arranged along an orthogonal direction to a picture-frame. In this case, with respect to a longer distance in the direction along the picture-frame, the first region and the second region are arranged in parallel. This reduces a difference in the characteristics between the detecting device 201 and the reference device 202, thereby reducing the error in the detection of the ambient light AL which error is caused by the difference in the amount of stray light, compared with in the layout shown in FIG. 14. However, these effects are greater in the layouts shown in FIG. 4 and FIG. 5 than in the layout shown in FIG. 6, because each region is not separated in the orthogonal direction to the picture-frame in the layout shown in FIG. 6.

Figure 7:
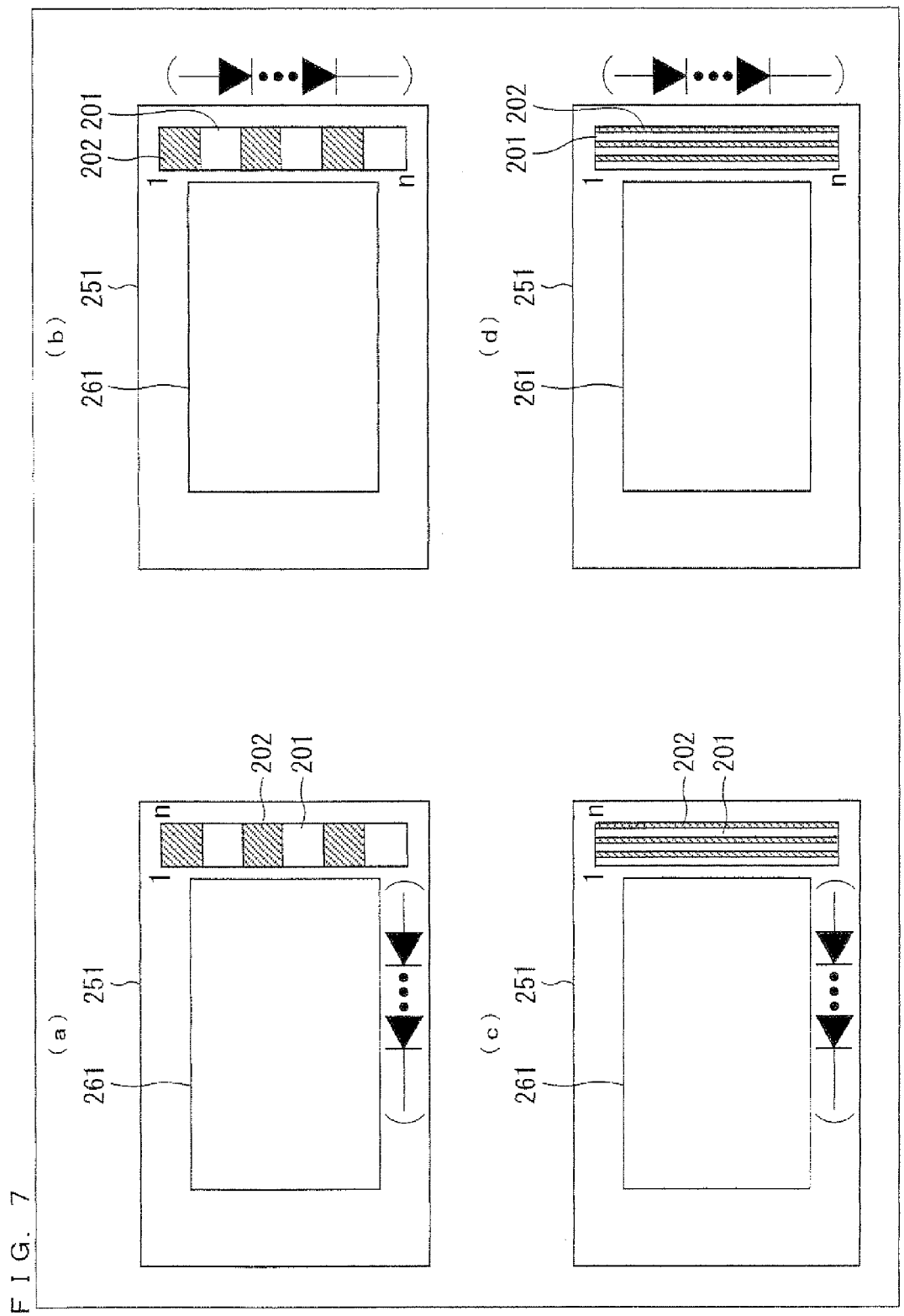
FIG. 7 is a plan view illustrating an example of a combination of (i) an arrangement of the ambient light sensor and (ii) a direction of PIN photodiodes. (a) through (d) of FIG. 7 show different combinations.

Each of (a) and (b) of FIG. 7 shows an example of a direction in which the PIN photodiodes 413 are provided and connected in the configuration shown in FIG. 3. Here, an advantage achieved in a case where n is 2 or more is particularly considered, however, n=1 is also possible. In (a) of FIG.

7, a direction extending from the anode to the cathode corresponds to an orthogonal direction to a picture-frame. The series connection of n PIN photodiode(s) is also made along this direction. The parallel connection is made in a direction along the picture-frame, in each of the regions and in the whole of the regions. At this time, the series connection of n PIN photodiode(s) is regarded as one branch of the parallel connection. In (b) of FIG. 7, a direction extending from the anode to the cathode corresponds to a direction along a picture-frame. The series connection in each region is also made in this direction, and the series connection of n PIN photodiode(s) in the whole of the regions is also made in this direction. The parallel connection is made in an orthogonal direction to the picture-frame in each region. At this time, each of the series connections is regarded as one branch of the parallel connection.

Each of (c) and (d) of FIG. 7 shows an example of a direction in which the PIN photodiodes 413 are provided and connected in the configuration shown in FIG. 5. In (c) of FIG. 7, a direction extending from the anode to the cathode corresponds to an orthogonal direction to a picture-frame. The series connection in each region is also made in this direction, and the series connection of n PIN photodiode(s) in the whole of the regions is also made in this direction. The parallel connection in each region is made in a direction along the picture-frame. At this time, each of the series connections is regarded as one branch of the parallel connection. In (d) of FIG. 7, a direction extending from the anode to the cathode corresponds to a direction along a picture-frame. The series connection of n PIN photodiode(s) is also made in this direction. The parallel connection is made in an orthogonal direction to the picture-frame in each region and in the whole of the regions. At this time, each of the series connections is regarded as one branch of the parallel connection.

Particularly, with the arrangement of (b) of FIG. 7, in each of the second regions, almost the same amount of stray light reaches the anode-side terminals and the cathode-side terminals of the respective PIN photodiodes 413 of each series connection, the characteristics of the PIN photodiodes 413 are almost equalized, and therefore the PIN photodiodes 413 generate the same number of carriers. This allows the open circuit voltages Voc of the respective PIN photodiodes 413 to be equalized. Considering this point, the configuration shown in (b) of FIG. 7 is more preferable than the configurations of (a), (c), and (d) of FIG. 7.

In each of (a) to (d) of FIG. 7, the above-described direction extending from the anode to the cathode of the PIN photodiode 413 may be changed to a desired direction which is different from the above-described direction, for example, the direction may be changed to a direction perpendicular to the above-described direction, as far as the direction of the series connection and the direction of the parallel connection are set as described above.

Further, by separately providing the power source voltage generating devices 266a described with reference to FIG. 1 and FIG. 2 in the second regions, the open circuit voltage nVoc of the reference devices 202 as a whole and the open circuit voltage nVoc of the power source voltage generating devices 266a as a whole are almost equalized.

Furthermore, carrying out laser annealing in a direction in which a channel direction allows a current to flow more smoothly. Assume that, in (a), (b), (c), and (d) of FIG. 7, the laser annealing is carried out in the direction along the picture-frame. In this case, the configurations shown in (b) and (d) of FIG. 7, in each of which the channel direction is along the picture-frame, are more preferable than the configurations shown in (a) and (c) of FIG. 7, because the channel direction is orthogonal to the picture-frame in the configurations shown in (a) and (c) of FIG. 7. On the other hand, assume that the laser annealing is carried out in the orthogonal direction to the picture-frame. In this case, the configurations shown in (a) and (c) of FIG. 7 are more preferable than the configurations shown in (b) and (d) of FIG. 7, because the channel direction is orthogonal to the picture-frame in the configurations shown in (b) and (d) of FIG. 7.

FIG. 22 shows views more specifically illustrating the configurations shown in FIG. 7. In (a) and (b) of FIG. 22, the PIN photodiodes 413 are connected in series horizontally, and are connected in parallel vertically. In (c) and (d) of FIG. 22, the PIN photodiodes 413 are connected in series vertically, and are connected in parallel horizontally.

Assume that, in (a), (b), (c), and (d) of FIG. 22, a separating direction in which the first regions and the second regions are away from the backlight 253 is projected on a panel surface of the display panel 251, and the separating direction thus projected corresponds to the orthogonal direction to the picture-frame. In this case, in each of (a) and (b) of FIG. 22, the total amount of stray light reaching the first regions is equal to the total amount of stray light reaching the second regions. Therefore, the open circuit voltage nVoc of the detecting devices 201 is equal to the open circuit voltage nVoc of the reference devices 202. Particularly in (b) of FIG. 22, in each series circuit of each of the detecting devices 201 and in each series circuit of each of the reference devices 202, a distance between the backlight 253 and respective of the PIN photodiodes 413 is uniform. In this case, stray light from the backlight 253 equally reaches respective of the PIN photodiodes 413 of each series connection. This causes the open circuit voltages Voc of the respective PIN photodiodes 413 to be equalized.

Further, also in (c) and (d) of FIG. 22, the total amount of stray light reaching the first regions is equal to the total amount of stray light reaching the second regions. Therefore, the open circuit voltage nVoc of the detecting devices 201 is equal to the open circuit voltage nVoc of the reference devices 202. Particularly in (d) of FIG. 22, in the parallel connections of the respective detecting devices 201 and in the parallel connections of the respective reference devices 202, corresponding ones of the PIN photodiodes 413 are equally away from the backlight 253. In this case, stray light from the backlight 253 equally reaches the respective anode-side terminals or the respective cathode-side terminals of the corresponding ones of the PIN photodiodes 413 in the parallel connections. Thereby, the stray light equally reaches the respective anode-side terminals and the respective cathode-side terminals of the PIN photodiodes 413 connected in parallel with each other. In each of the first regions and in each of the second regions, the characteristics of the PIN photodiodes 413 are almost equalized. Therefore, in each of the first regions and in each of the second regions, the PIN photodiodes 413 generate the same number of carriers. This allows the open circuit voltages Voc of the respective PIN photodiodes 413 to be equalized.

Thus, these configurations are preferable in this order: (b)>(a), (d)>(c).

On the other hand, assume that, in (a), (b), (c), and (d) of FIG. 22, a separating direction in which the first regions and the second regions are away from the backlight 253 is projected on the panel surface of the display panel 251, and the separating direction thus projected corresponds to the direction along the picture-frame. In this case, in (c) and (d) of FIG. 22, the total amount of stray light reaching the first regions is equal to the total amount of stray light reaching the second regions. Therefore, the open circuit voltage nVoc of the detecting devices 201 is almost equal to the open circuit voltage nVoc of the reference devices 202.

Further, also in (a) and (b) of FIG. 22, the total amount of stray light reaching the first regions is equal to the total amount of stray light reaching the second regions. Therefore, the open circuit voltage nVoc of the detecting devices 201 is equal to the open circuit voltage nVoc of the reference devices 202. Particularly in (a) of FIG. 22, in the parallel connections of the respective detecting devices 201 and in the parallel connections of the respective reference devices 202, corresponding ones of the PIN photodiodes 413 are equally away from the backlight 253. In this case, stray light from the backlight 253 equally reaches the respective anode-side terminals or the respective cathode-side terminals of the corresponding ones of the PIN photodiodes 413 in the parallel connections. Thereby, the stray light equally reaches the respective anode-side terminals and the respective cathode-side terminals of the PIN photodiodes 413 connected in parallel with each other. In each of the first regions and in each of the second regions, the characteristics of the PIN photodiodes 413 are almost equalized. Therefore, in each of the first regions and in each of the second regions, the PIN photodiodes 413 generate the same number of carriers. This allows the open circuit voltages Voc of the respective PIN photodiodes 413 to be equalized. Thus, these configurations are preferable in this order: (c)>(a), (d)>(b).

In the descriptions given above, the present embodiment was explained.

In the present embodiment, the configuration shown in FIG. 4 was explained as one example of a configuration of an ambient light sensor. However, it is understood that detection can be carried out similarly even in a case where the positions of the anode and the cathode of the PIN photodiode 413 are interchanged. Needles to say, in this case, it is possible to select the electric potentials of the wiring L1 and the wiring L3 as needed, for example, by connecting a cathode-side terminal with GND used as a reference electric potential. Further, the configuration may be freely designed. For example, (i) the integration operation using the operational amplifier may be altered so that it decreases an output voltage Vo as an integration proceeds, or (ii) an amplifier (such as an inverting amplifier or a non-inverting amplifier), an adding circuit, a subtracting circuit, and/or the like may be provided so as to carry out a process after the integral operation is carried out.

Further, in the present embodiment, the detecting device 201 and the reference device 202 are formed on the display panel monolithically. However, the present invention is not limited to this, and the detecting device 201 and the reference device 202 may be provided on the display panel by means of other means such as in the form of a COG. In this case, the light shields 203 and 204 may be formed on or inside the chips of the detecting device 201 and the reference device 202.

The photoelectric conversion device element may be a phototransistor or the like, instead of the PIN photodiode.

Figure 8:
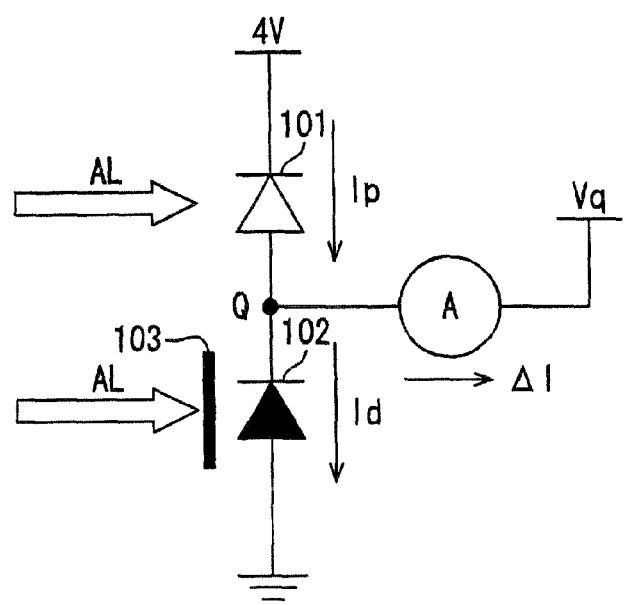
FIG. 8, related to conventional art, is a circuit diagram illustrating a first configuration of an ambient light sensor.
Figure 9:
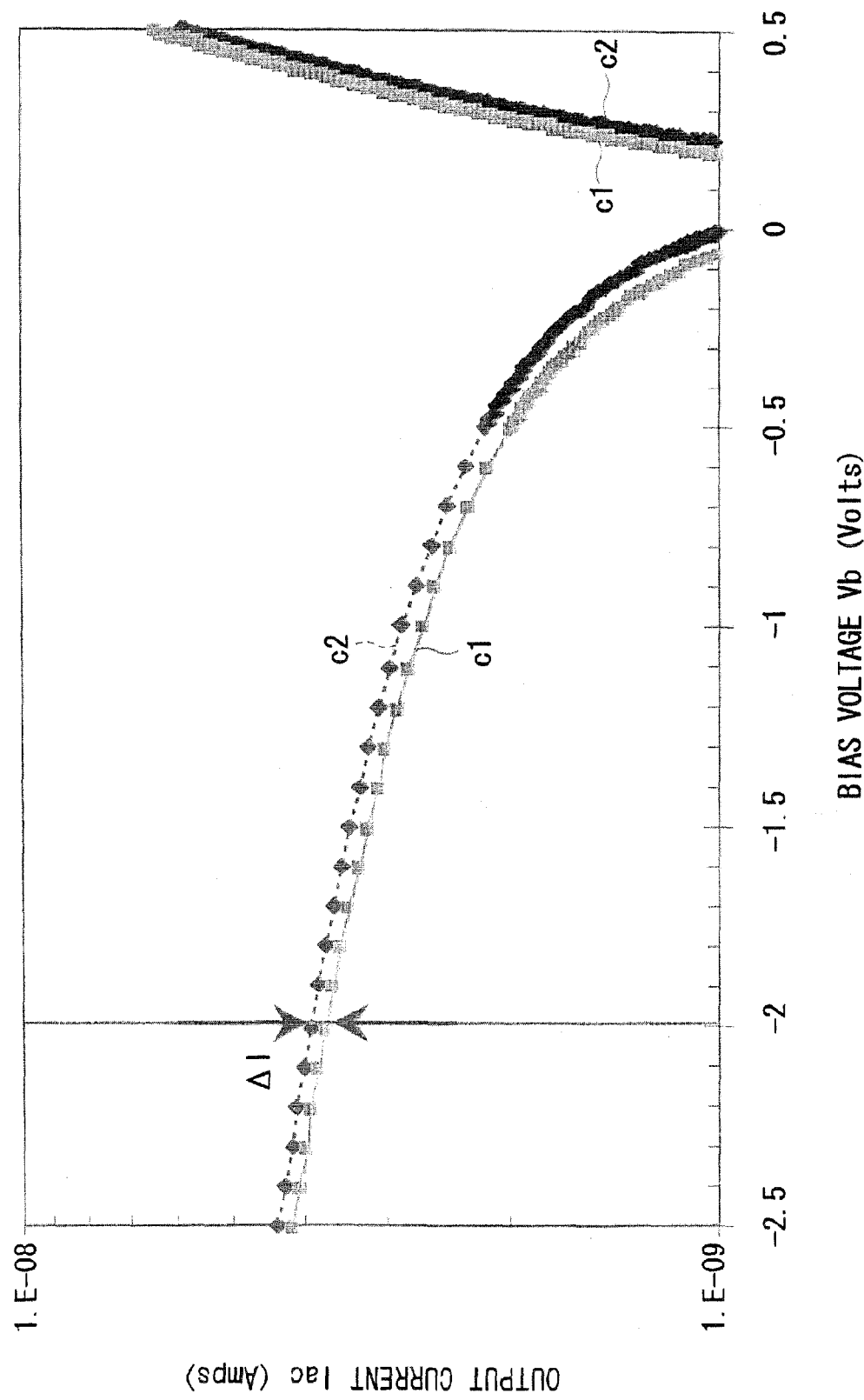
FIG. 9 is a first graph illustrating a relationship between an output current and a bias voltage with respect to one PIN photodiode.

The light shield 204 shown in FIG. 1 may be used as a light shield for a generally-used reference PIN photodiode, for example, the light shield 103 for the ambient light sensor shown in FIG. 8. The detection method is also arbitrary selected. For example, the detection may be carried out by means of current amplification or current-voltage conversion, without carrying out the integration of ambient light.

Further, the display device is not limited to the liquid crystal display device. The display device may be arbitrary selected and only needs to be the one capable of adjusting a luminance of display by using an ambient light sensor. For example, an EL display device or a plasma display is possible.

Furthermore, the present invention is not limited to portable terminals such as a mobile phone or a PDA. Display devices including display panels of various sizes, from a small one to a large one, are possible.

1. Note that the followings are also possible as the display device.

(1)

A display device, including: a display panel; and an ambient light sensor which detects an intensity of ambient light on a display surface side of the display panel in response to photoelectric conversions made by at least one photoelectric conversion device provided in the display panel, said display device adjusting a luminance of display on the display surface in accordance with the intensity of the ambient light which intensity is detected by the ambient light sensor, said, display device further including: a first shield electrode, provided in the display panel so as to be closer to a back surface side of the display panel than wiring for transmitting an output from said at least one respective photoelectric conversion device is, the first shield electrode serving as a shield against an electric field.

According to this invention, there is provided the first shield electrode provided in the display panel so as to be closer to the back surface side of the display panel than the wiring for transmitting an output from the photoelectric conversion device is, the first shield electrode serving as the shield against an electric field. This prevents noise induction with respect to the wiring for transmitting the output from the photoelectric conversion device, the noise induction occurring from the display surface side and the side opposite to the display surface side of the display panel.

Thus, it is possible to realize a display device in which inductive noise for wiring for transmitting an output from a photoelectric conversion device used for an ambient light sensor is further reduced.

(2)

The display device, further including: second shield electrodes provided on both lateral sides of the wiring, each serving as a shield against an electric field.

According to this invention, the second shield electrodes are additionally provided as the shields against an electric field. This further reduces the inductive noise for the wiring.

(3)

The display device, further including: a third shield electrode, provided in the display panel so as to be closer to the display surface side of the display panel than the wiring is, the third shield electrode serving as a shield against an electric field.

According to this invention, the third shield electrode is additionally provided as the shield against an electric field. This further reduces the inductive noise for the wiring.

(4)

The display device, further including: second shield electrodes, connected with the first shield electrode, which are provided on both lateral sides of the wiring; and a third shield electrode, connected with the second shield electrodes, which is provided in the display panel so as to be closer to the display surface side of the display panel than the wiring is.

According to this invention, the second shield electrodes and the third shield electrode are additionally provided as the shields against an electric field, the second shield electrodes and the third shield electrode being connected with the first shield electrode. This allows the wiring to be almost surrounded by the shields against an electric field, or to be surrounded by the shields against an electric field. This significantly reduces the inductive noise for the wiring.

(5)

The display device, wherein: the ambient light sensor is configured such that: said at least one photoelectric conversion device has two current output terminals, and one of the two current output terminals is connected with a power source supplying a reference electric potential; and an electric potential equal to an electric potential of the other one of the two current output terminals is applied to the first shield electrode.

According to this invention, the one of the two current output terminals of the photoelectric conversion device is connected with the power source supplying the reference electric potential. Therefore, in a case where said the other one of the two current output terminals has an electric potential which is determined on the basis of the reference electric potential and in accordance with an output from the photoelectric conversion device, the electric potential becomes equal to the electric potential of the first shield electrode. This prevents the electric potential from being changed due to a parasitic capacitance generated between the first shield electrode and wiring connected with said the other one of the two current output terminals. This makes it possible to stabilize the electric potential of the wiring connected with said the other one of the two current output terminals of the photoelectric conversion device.

(6)

The display device, wherein: the ambient light sensor is configured such that: said at least one photoelectric conversion device is (i) a first photoelectric conversion device on which the ambient light is incident and (ii) a second photoelectric conversion device, having a same configuration as that of the first photoelectric conversion device, which is in an environment in which light having a reference brightness is incident; and the second photoelectric conversion device generates an open circuit voltage which is applied to the first photoelectric conversion device as a bias voltage, and the ambient light sensor detects the intensity of the ambient light in accordance with a current outputted from the first photoelectric conversion device.

According to this invention, the bias voltage equal to the open circuit voltage generated by the second photoelectric conversion device (i.e., the open circuit voltage applied to the first photoelectric conversion device) is used to cause the first shield electrode to have the same electric potential as that of said the other one of the two current output terminals. This greatly contributes to accurate detection of an intensity of ambient light.

(7)

The display device, wherein: said, at least one photoelectric conversion device is configured to include a plurality of photoelectric conversion device elements, each having a same configuration, which are connected in series.

According to this invention, the open circuit voltage generated by the second photoelectric conversion device is the sum of open circuit voltages of the second photoelectric conversion device elements included in the second photoelectric conversion device. Thanks to this, an error hardly occurs in detection of the current outputted from the first photoelectric conversion device. Therefore, causing the first shield electrode to have the same electric potential as that of said the other one of the two current output terminals so that the open circuit voltage is stably applied to the first photoelectric conversion device greatly contributes to accurate detection of an intensity of ambient light.

(8)

The display device, wherein: said at least one photoelectric conversion device is configured to include a plurality of series circuits connected in parallel with each other, the plurality of series circuits each having at least one photoelectric conversion device element of same number and of same configuration.

According to this invention, the plurality of series circuits of the photoelectric conversion device elements are connected in parallel with each other. This increases a current outputted from the photoelectric conversion device per unit amount of incident light, thereby improving detection accuracy of an intensity of ambient light.

(9)

The display device, wherein: said at least one photoelectric conversion device includes a single photoelectric conversion device element or a combination of photoelectric conversion device elements, each of the photoelectric conversion device element(s) being made of a PIN photodiode.

With this invention, in the ambient light sensor using the PIN photodiode, which is easy to be formed on the display panel monolithically, it is possible to reduce the inductive noise for the PIN photodiode.

(10)

The display device, wherein: the PIN photodiode is a lateral PIN photodiode.

With this invention, in the ambient light sensor using the lateral PIN photodiode, which is suitably formed on the display panel monolithically (especially in terms of its process), it is possible to reduce the inductive noise for the lateral PIN photodiode.

(11)

The display device, wherein: said at least one photoelectric conversion device includes a single photoelectric conversion device element or a combination of photoelectric conversion device elements, each of the photoelectric conversion device element(s) being made of a phototransistor.

With this invention, in the ambient light sensor using the phototransistor, it is possible to reduce the inductive noise for the phototransistor.

(12)

The display device, wherein: the display panel is a thin film transistor liquid crystal panel; the wiring is formed in a picture-frame region of a substrate of a thin film transistor and in a layer where a source electrode of the thin film transistor is provided; and the first shield electrode is formed in the picture-frame region and in a layer where a gate electrode of the thin film transistor is provided.

With this invention, it is possible to easily manufacture the wiring and the first shield electrode by using a process for the TFT liquid crystal panel.

(13)

The display device, wherein: the display panel is a thin film transistor liquid crystal panel; and the wiring and the second shield electrodes are formed in a picture-frame region of a substrate of a thin film transistor and in a layer where a source electrode of the thin film transistor is provided.

With this invention, it is possible to easily manufacture the wiring and the second shield electrode by using a process for the TFT liquid crystal panel.

(14)

The display device, wherein: the display panel is a thin film transistor liquid crystal panel; the wiring is formed in a picture-frame region of a substrate of a thin film transistor and in a layer where a source electrode of the thin film transistor is provided; and the third shield electrode is formed in the picture-frame region and in a layer where a pixel electrode is provided.

With this invention, it is possible to easily manufacture the wiring and the third shield electrode by using a process for the TFT liquid crystal panel.

(15)

The display device, wherein: the display panel is a thin film transistor liquid crystal panel; the wiring is formed in a picture-frame region of a substrate of a thin film transistor and in a layer where a source electrode of the thin film transistor is provided; the first shield electrode is formed in the picture-frame region and in a layer where a gate electrode of the thin film transistor is provided; the second shield electrodes are formed in the picture-frame region and in the layer where the source electrode of the thin film transistor is provided; and the third shield electrode is formed in the picture-frame region and in a layer where a pixel electrode is provided.

With this invention, it is possible to easily manufacture the wiring, the first shield electrode, the second shield, electrode, and the third shield electrode by using a process for the TFT liquid crystal panel.

(16)

The display device, wherein: the display panel includes a reflective electrode, directly stacked on the pixel electrode, for displaying in a reflective mode; and a fourth shield electrode, formed in a layer where the reflective electrode is provided, is provided on the third shield electrode.

According to this invention, the fourth shield electrode is stacked on the third shield electrode. This reduces sheet resistances of the shield electrodes. Therefore, it is possible to improve a shielding effect against an electric field by using the reflective electrode layer, which already exists.

(17)

The display device, wherein: a luminance of a light source of a backlight is adjusted in accordance with the intensity of the ambient light which intensity is detected by the ambient light sensor so that the luminance of the display on the display surface is adjusted.

With this invention, in the display device in which the luminance of the light source of the backlight is adjusted in accordance with the intensity of the ambient light, it is possible to reduce the inductive noise for the photoelectric conversion device.

2. Note that the followings are also possible as the display device.

(1)

A display device, including: a display panel; and an ambient light sensor which detects an intensity of ambient light on a display surface side of the display panel in response to photoelectric conversions made by respective photoelectric conversion devices provided in the display panel, said display device adjusting a luminance of display on the display surface in accordance with the intensity of the ambient light which intensity is detected by the ambient light sensor, the ambient light sensor being configured such that the photoelectric conversion devices are (i) first photoelectric conversion devices on each of which the ambient light is incident and (ii) second photoelectric conversion devices, each having a same configuration as that of each of the first photoelectric conversion devices, each of which second photoelectric conversion devices is in an environment in which light having a reference brightness is incident, the ambient light sensor detecting the intensity of the ambient light in accordance with outputs from the respective first photoelectric conversion devices while using outputs from the respective second photoelectric conversion devices as references, and (i) first regions where the respective first photoelectric conversion devices are provided and (ii) second regions where the respective second photoelectric conversion devices are provided being separately provided so as to be alternated in a surface of the display panel.

According to this invention, (i) the first regions where the respective first photoelectric conversion devices are provided and (ii) the second regions where the respective second photoelectric conversion devices are provided are separately provided so as to be alternated in the surface of the display panel. Therefore, an average of the characteristics of all of the respective first regions is obtained as representative characteristics of the first photoelectric conversion devices; an average of the characteristics of all of the respective second regions is obtained as representative characteristics of the second photoelectric conversion devices. Therefore, (i) the representative characteristics of the first photoelectric conversion devices and (ii) the representative characteristics of the second photoelectric conversion devices can be almost equalized. This applies even in a case where there is a great variation in the characteristics of the photoelectric conversion device elements in the surface, the photoelectric conversion device elements configuring the photoelectric conversion device. Further, even in a case where (i) the amounts of stray light reaching the first regions are different and (ii) the amounts of stray light reaching the second regions are different, an effect of the stray light given to the whole of the first photoelectric conversion devices and an effect of the stray light given to the whole of the second photoelectric conversion devices are almost equalized. This makes it possible to reduce an error in detection of ambient light which error is caused by a difference in the amount of stray light.

Thus, it is possible to realize a display device capable of accurately detecting an intensity of ambient light even in a case where there is a great variation in the characteristics of photoelectric conversion device elements in a display panel, the photoelectric conversion device elements configuring a photoelectric conversion device.

(2)

The display device, wherein: the first and second regions are separately provided so as to be alternated along a picture-frame in a region of the picture-frame of the display panel.

With this invention, it is possible to easily realize a layout of the first photoelectric conversion devices and the second photoelectric conversion devices by which layout the characteristics of the photoelectric conversion device elements are averaged.

(3)

The display device, wherein: the first and second regions are separately provided so as to be alternated, in an orthogonal direction to a picture-frame, in a region of the picture-frame of the display panel.

With this invention, it is possible to easily realize a layout of the first photoelectric conversion devices and the second photoelectric conversion devices by which layout the characteristics of the photoelectric conversion device elements are averaged.

(4)

The display device, wherein: in each of the first and second regions, there is provided a series circuit in which a plurality of photoelectric conversion device elements having a same configuration are connected in series in an orthogonal direction to the picture-frame; and the series circuits in the respective first regions are connected in parallel with each other, and the series circuits in the respective second regions are connected in parallel with each other.

With this invention, it is possible to easily realize a layout of the first photoelectric conversion devices and the second photoelectric conversion devices by which layout the characteristics of the photoelectric conversion device elements are averaged.

(5)

The display device, wherein: in each of the first and second regions, there are provided a plurality of series circuits in each of which a plurality of photoelectric conversion device elements having a same configuration are connected in series in an orthogonal direction to the picture-frame, the plurality of series circuits being connected in parallel with each other along the picture-frame so as to form a parallel circuit; and the parallel circuits in the respective first regions are connected in parallel with each other, and the parallel circuits in the respective second regions are connected in parallel with each other.

With this invention, it is possible to easily realize a layout of the first photoelectric conversion devices and the second photoelectric conversion devices by which layout the characteristics of the photoelectric conversion device elements are averaged.

(6)

The display device, wherein: in each of the first and second regions, there is provided a series circuit in which a plurality of photoelectric conversion device elements having a same configuration are connected in series along the picture-frame; and the series circuits in the respective first regions are connected in series, and the series circuits in the respective second regions are connected in series.

With this invention, it is possible to easily realize a layout of the first photoelectric conversion devices and the second photoelectric conversion devices by which layout the characteristics of the photoelectric conversion device elements are averaged.

(7)

The display device, wherein: in each of the first and second regions, there are provided a plurality of series circuits in each of which a plurality of photoelectric conversion device elements having a same configuration are connected in series along the picture-frame, the plurality of series circuits being connected in parallel with each other in an orthogonal direction to the picture-frame so as to form a parallel circuit; and the parallel circuits in the respective first regions are connected in series, and the parallel circuits in the respective second regions are connected in series.

With this invention, it is possible to easily realize a layout of the first photoelectric conversion devices and the second photoelectric conversion devices by which layout the characteristics of the photoelectric conversion device elements are averaged.

(8)

The display device, wherein: in each of the first and second regions, there is provided a parallel circuit in which a plurality of photoelectric conversion device elements having a same configuration are connected in parallel with each other along the picture-frame; and the parallel circuits in the respective first regions are connected in series, and the parallel circuits in the respective second regions are connected in series.

With this invention, it is possible to easily realize a layout of the first photoelectric conversion devices and the second photoelectric conversion devices by which layout the characteristics of the photoelectric conversion device elements are averaged.

(9)

The display device, wherein: in each of the first and second regions, there are provided a plurality of series circuits in each of which a plurality of photoelectric conversion device elements having a same configuration are connected in series in the orthogonal direction to the picture-frame, the plurality of series circuits being connected in parallel with each other along the picture-frame so as to form a parallel circuit; and the parallel circuits in the respective first regions are connected in series, and the parallel circuits in the respective second regions are connected in series.

With this invention, it is possible to easily realize a layout of the first photoelectric conversion devices and the second photoelectric conversion devices by which layout the characteristics of the photoelectric conversion device elements are averaged.

(10)

The display device, wherein: in each of the first and second regions, there is provided a series circuit in which a plurality of photoelectric conversion device elements having a same configuration are connected in series along the picture-frame; and the series circuits in the respective first regions are connected in parallel with each other, and the series circuits in the respective second regions are connected in parallel with each other.

With this invention, it is possible to easily realize a layout of the first photoelectric conversion devices and the second photoelectric conversion devices by which layout the characteristics of the photoelectric conversion device elements are averaged.

(11)

The display device, wherein: in each of the first and second regions, there are provided a plurality of series circuits in each of which a plurality of photoelectric conversion device elements having a same configuration are connected in series along the picture-frame, the plurality of series circuits being connected in parallel with each other in the orthogonal direction to the picture-frame so as to form a parallel circuit; and the parallel circuits in the respective first regions are connected in parallel with each other, and the parallel circuits in the respective second regions are connected in parallel with each other.

With this invention, it is possible to easily realize a layout of the first photoelectric conversion devices and the second photoelectric conversion devices by which layout the characteristics of the photoelectric conversion device elements are averaged.

(12)

The display device, wherein: the ambient light sensor detects the intensity of the ambient light in accordance with outputs from the respective first photoelectric conversion devices while using outputs from the respective second photoelectric conversion devices as the references in such a manner that the respective second photoelectric conversion devices generate open circuit voltages which are applied to the respective first photoelectric conversion devices as bias voltages, and the ambient light sensor detects the intensity of the ambient light in accordance with currents outputted from the respective first photoelectric conversion devices.

An open circuit voltage generated by the second photoelectric conversion device is feeble. The feeble open circuit voltage is applied to the first photoelectric conversion device as the bias voltage, so as to affect a current outputted from the first photoelectric conversion device. Therefore, according to this invention, averaging the characteristics of the first photoelectric conversion devices and the characteristics of the second photoelectric conversion devices greatly contributes to accurate detection of ambient light.

(13)

The display device, wherein: laser annealing is carried out along the picture-frame of the display panel, in a side of the picture-frame of the display panel in which side the first photoelectric conversion devices and the second photoelectric conversion devices are provided.

According to this invention, the laser annealing is carried out along the picture-frame of the display panel. Therefore, in a case where (i) a channel direction in which a channel of the first photoelectric conversion device extends and (ii) a channel direction in which a channel of the second photoelectric conversion device extends include a direction along the picture-frame, a current flows more smoothly in the part of the first photoelectric conversion device and/or the second photoelectric conversion device in which part the channel directions are along the picture-frame.

(14)

The display device, wherein: laser annealing is carried out in the orthogonal direction to the picture-frame of the display panel, in a side of the picture-frame of the display panel in which side the first photoelectric conversion devices and the second photoelectric conversion devices are provided.

According to this invention, the laser annealing is carried out in the orthogonal direction to the picture-frame of the display panel. Therefore, in a case where (i) the channel direction in which the channel of the first photoelectric conversion device extends and (ii) the channel direction in which the channel of the second photoelectric conversion device extends include the orthogonal direction to the picture-frame, a current flows more smoothly in the part of the first photoelectric conversion device and/or the second photoelectric conversion device in which part the channel directions correspond to the orthogonal direction to the picture-frame.

(15)

The display device, wherein: the first and second photoelectric conversion devices are provided in a side of the picture-frame of the display panel such that (i) a direction in which each channel of the first photoelectric conversion devices extends and (ii) a direction in which each channel of the second photoelectric conversion devices extends are parallel to a direction in which laser annealing is carried out.

According to this invention, (i) the direction in which each channel of the first photoelectric conversion devices extends and (ii) the direction in which each channel of the second photoelectric conversion devices extends are parallel to the direction in which the laser annealing is carried out. This causes a current to flow more smoothly to the first photoelectric conversion device and the second photoelectric conversion device.

(16)

The display device, wherein: an average of a distance between a backlight and respective of the first regions is equal to an average of a distance between the backlight and respective of the second regions.

According to this invention, the stray light from the backlight equally reaches respective of the first photoelectric conversion devices and the second photoelectric conversion devices. This makes it possible to easily cause (i) the open circuit voltage of the first photoelectric conversion devices and (ii) the open circuit voltage of the second photoelectric conversion devices to be equalized.

(17)

The display device, wherein: each of the first photoelectric conversion devices includes a series connection in which photoelectric conversion device elements are connected in series, and each of the second photoelectric conversion devices includes a series connection in which photoelectric conversion device elements whose number is equal to that of each of the first photoelectric conversion devices are connected in series; and in each series connection of each of the respective first photoelectric conversion devices and in each series connection of each of the respective second photoelectric conversion devices, a distance between the backlight and respective of the photoelectric conversion device elements is uniform.

According to this invention, the stray light from the backlight equally reaches respective of the photoelectric conversion device elements in each series connection. This makes it possible to equalize the open circuit voltages of the respective photoelectric conversion device elements.

(18)

The display device, wherein: each of the first photoelectric conversion devices includes a parallel connection in which photoelectric conversion device elements are connected in parallel with each other, and each of the second photoelectric conversion devices includes a parallel connection in which photoelectric conversion device elements whose number is equal to that of the first photoelectric conversion devices are connected in parallel with each other; and in the parallel connections of the respective first photoelectric conversion devices and in the parallel connections of the respective second photoelectric conversion devices, corresponding ones of the photoelectric conversion device elements are equally away from the backlight.

With this invention, the stray light from the backlight equally reaches both ends of the respective corresponding ones of the photoelectric conversion device elements in the parallel connections. This makes it possible to equalize the open circuit voltages of the respective photoelectric conversion device elements.

(19)

The display device, wherein: each of the photoelectric conversion devices includes a single photoelectric conversion device element or a combination of photoelectric conversion device elements, each of the photoelectric conversion device element(s) being made of a PIN photodiode.

With this invention, in the ambient light sensor using the PIN photodiode, which is easy to be formed on the display panel monolithically, it is possible to reduce the inductive noise for the PIN photodiode.

(20)

The display device, wherein: the PIN photodiode is a lateral PIN photodiode.

With this invention, in the ambient light sensor using the lateral PIN photodiode, which is suitably formed on the display panel monolithically (especially in terms of its process), it is possible to reduce the inductive noise for the lateral PIN photodiode.

(21)

The display device, wherein: each of the photoelectric conversion devices includes a single photoelectric conversion device element or a combination of photoelectric conversion device elements, each of the photoelectric conversion device element(s) being made of a phototransistor.

With this invention, in the ambient light sensor using the phototransistor, it is possible to reduce the inductive noise for the phototransistor.

(22)

The display device, wherein: the display panel is a liquid crystal panel; and a luminance of a light source of the backlight is adjusted in accordance with the intensity of the ambient light which intensity is detected by the ambient light sensor so that the luminance of the display on the display surface is adjusted.

With this invention, in the display device in which a luminance of the light source of the backlight is adjusted in accordance with an intensity of ambient light, it is possible to reduce the inductive noise for the photoelectric conversion device.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a display device of the present invention includes: a display panel; and an ambient light sensor which detects an intensity of ambient light on a display surface side of the display panel in response to photoelectric conversions made by at least one photoelectric conversion device provided in the display panel, said display device adjusting a luminance of display on the display surface in accordance with the intensity of the ambient light which intensity is detected by the ambient light sensor, said display device further including: a light shield against stray light, provided in the display panel so as to be closer to a back surface side of the display panel than said at least one photoelectric conversion device is, the light shield being made of a conductive material, and a predetermined electric potential being applied to the light shield.

Thus, it is possible to realize a display device in which inductive noise for a photoelectric conversion device used for an ambient light sensor is further reduced.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is suitable particularly to a portable liquid crystal display devices.

The invention claimed is:

1. A display device, comprising:
a display panel; and
an ambient light sensor which detects an intensity of ambient light on a display surface side of the display panel in response to photoelectric conversions made by at least one photoelectric conversion device provided in the display panel,
said display device adjusting a luminance of display on the display surface in accordance with the intensity of the ambient light which intensity is detected by the ambient light sensor,
a light shield against stray light, provided in the display panel so as to be closer to a back surface side of the display panel than said at least one photoelectric conversion device is, the light shield being made of a conductive material,
a predetermined electric potential being applied to the light shield, and
wherein the ambient light sensor is configured such that said at least one photoelectric conversion device comprises (i) a first photoelectric conversion device on which the ambient light is incident and (ii) a second photoelectric conversion device, having a same configuration as that of the first photoelectric conversion device, which is in an environment in which light having a reference brightness is incident; and an open circuit voltage generated by the second photoelectric conversion device is applied to the first photoelectric conversion device as a bias voltage, and the ambient light sensor detects the intensity of the ambient light in accordance with a current outputted from the first photoelectric conversion device.

2. The display device as set forth in claim 1, wherein:
the ambient light sensor is configured such that:
said at least one photoelectric conversion device comprises an anode and cathode, and the anode is connected with a power source supplying a reference electric potential; and
an electric potential is supplied to the cathode, the electric potential being set to be equal to the predetermined electric potential.

3. The display device as set forth in claim 2, wherein:
said at least one photoelectric conversion device is configured to include a plurality of photoelectric conversion device elements, each having a same configuration, which are connected in series.

4. The display device as set forth in claim 2, wherein: the predetermined electric potential is supplied from said cathode.

5. The display device as set forth in claim 1, wherein:
said at least one photoelectric conversion device is configured to include a plurality of series circuits connected in parallel with each other, the plurality of series circuits each having at least one photoelectric conversion device element of same number and of same configuration.

6. The display device as set forth in claim 1, wherein:
said at least one photoelectric conversion device includes a single photoelectric conversion device element or a combination of photoelectric conversion device elements, each of the photoelectric conversion device element(s) being made of a PIN photodiode.

7. The display device as set forth in claim 6, wherein: the PIN photodiode is a lateral PIN photodiode.

8. The display device as set forth in claim 1, wherein:
said at least one photoelectric conversion device includes a single photoelectric conversion device element or a combination of photoelectric conversion device elements, each of the photoelectric conversion device element(s) being made of a phototransistor.

9. The display device as set forth in claim 1, wherein:
the display panel is a thin film transistor liquid crystal panel; and
said at least one photoelectric conversion device is formed in a picture-frame region of a substrate of a thin film transistor and in a layer where an activating layer of the thin film transistor is provided.

10. The display device as set forth in claim 9, wherein:
the light shield is formed, in the picture-frame region, below a layer where a gate electrode of the thin film transistor is provided, in a direction in which layers of the thin film transistor are stacked,
said display device further comprising:
a first connecting electrode, connected with the light shield, which is provided in the picture-frame region and is formed in the layer where the gate electrode is provided; and
a second connecting electrode, connected with the first connecting electrode, which is provided in the picture-frame region and is formed in a layer where a source electrode of the thin film transistor is provided,
the second connecting electrode being connected with the power source supplying the predetermined electric potential.

11. The display device as set forth in claim 9, further comprising:
a shield against an electric field, provided in the display panel so as to be closer to the display surface side of the display panel than said at least one photoelectric conversion device is, which shield is formed in a layer where a pixel electrode is formed.

12. The display device as set forth in claim 9, wherein:
a luminance of a light source of a backlight is adjusted in accordance with the intensity of the ambient light which intensity is detected by the ambient light sensor so that the luminance of the display on the display surface is adjusted.

13. The display device as set forth in claim 1, further comprising:
a shield against an electric field which shield is provided in the display panel so as to be closer to the display surface side of the display panel than said at least one photoelectric conversion device is.

* * * * *